(12) United States Patent
Kim

(10) Patent No.: US 10,700,707 B2
(45) Date of Patent: Jun. 30, 2020

(54) CIRCUIT FOR TRANSFORMING PARITY-CHECK MATRIX OF QC-LDPC CODE, ERROR CORRECTION CIRCUIT HAVING THE SAME, AND METHOD OF OPERATING THE SAME

(71) Applicant: SK hynix Inc., Gyeonggi-do (KR)

(72) Inventor: Jang Seob Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 64 days.

(21) Appl. No.: 16/194,750

(22) Filed: Nov. 19, 2018

(65) Prior Publication Data
US 2019/0341935 A1 Nov. 7, 2019

(30) Foreign Application Priority Data
May 4, 2018 (KR) .................. 10-2018-0051975

(51) Int. Cl.
*H03M 13/00* (2006.01)
*H03M 13/11* (2006.01)
*G06F 17/14* (2006.01)
*G06F 11/10* (2006.01)

(52) U.S. Cl.
CPC ....... *H03M 13/116* (2013.01); *G06F 11/1012* (2013.01); *G06F 17/14* (2013.01); *H03M 13/611* (2013.01)

(58) Field of Classification Search
CPC .. H03M 13/116; H03M 13/118; H03M 13/15; H03M 13/6516; H03M 13/616; H03M 13/618; H03M 13/6306; H03M 13/255; H03M 13/611; H03M 10/1102; H03M 13/6561; H03M 13/13; H03M 13/6505; H03M 13/114; H03M 13/112; H03M 13/6502; H03M 13/6356; H03M 13/6393; H03M 13/036; H03M 13/1168; H03M 13/1185; G06F 11/10; G06F 11/1012; G06F 17/14; H01M 10/38; H04L 1/0063; H04L 1/00; H04L 1/0013; H04L 1/1819; H04L 1/0071
See application file for complete search history.

(56) References Cited

U.S. PATENT DOCUMENTS

2010/0169736 A1 7/2010 Garani
2016/0028419 A1 1/2016 Li et al.

*Primary Examiner* — Guerrier Merant
(74) *Attorney, Agent, or Firm* — IP & T Group LLP

(57) ABSTRACT

Provided herein may be a circuit for transforming a parity-check matrix of a Quasi-Cyclic Low-Density Parity-Check (QC-LDPC) code, an error correction circuit having the same, and a method of operating the same. The circuit for transforming a parity check matrix of a QC-LDPC code including circulant matrices may include a determination component configured to determine whether a parity-check matrix that is externally input has full rank, a selection component configured to detect linearly dependent rows or columns, among rows or columns of the parity-check matrix based on a result of the determination of the determination component, and select any one row or column from among the linearly dependent rows or columns, and an entry replacement component configured to replace any one of circulant matrices included in the selected one row or column with a zero matrix.

16 Claims, 18 Drawing Sheets

FIG. 1A
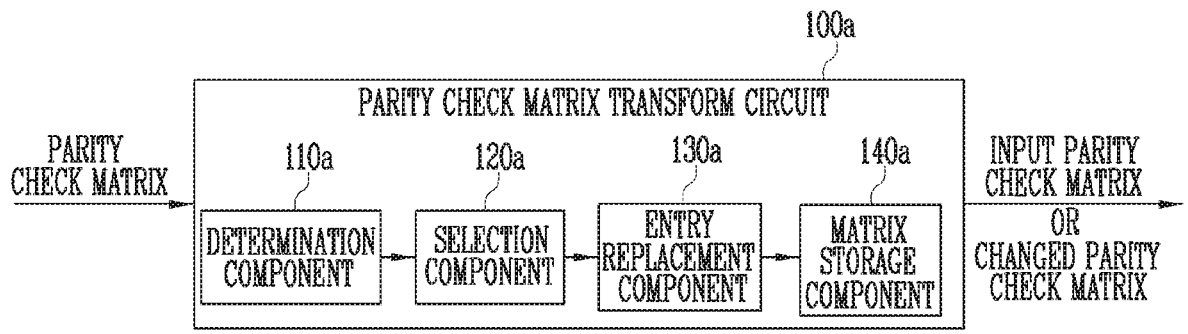
FIG. 1B
FIG. 2A
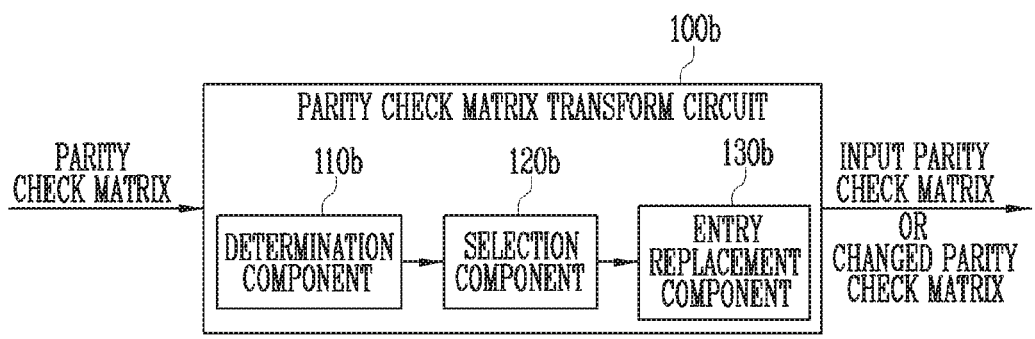

FIG. 2B $$A_{1,1} = \begin{bmatrix} 0 & 1 & 0 & \cdots & 0 \\ 0 & 0 & 1 & \cdots & 0 \\ \vdots & \vdots & \vdots & & \vdots \\ 0 & 0 & 0 & \cdots & 1 \\ 1 & 0 & 0 & \cdots & 0 \end{bmatrix} \Big\} k$$

$$\underbrace{\qquad\qquad}_{k}$$

$$A_{M,3} = \begin{bmatrix} 0 & 0 & 1 & \cdots & 0 \\ 0 & 0 & 0 & \cdots & 1 \\ \vdots & \vdots & \vdots & & \vdots \\ 1 & 0 & 0 & \cdots & 0 \\ 0 & 1 & 0 & \cdots & 0 \end{bmatrix} \Big\} k$$

$$\underbrace{\qquad\qquad}_{k}$$

$$A_{1,2} = \begin{bmatrix} 0 & 0 & 0 & \cdots & 0 \\ 0 & 0 & 0 & \cdots & 0 \\ \vdots & \vdots & \vdots & & \vdots \\ 0 & 0 & 0 & \cdots & 0 \\ 0 & 0 & 0 & \cdots & 0 \end{bmatrix} \Big\} k$$

$$\underbrace{\qquad\qquad}_{k}$$

FIG. 4

$$H = \begin{bmatrix} 1 & 0 & 1 & 0 & \cdots & 0 & 0 \\ A_{1,1} & A_{1,2} & A_{1,3} & A_{1,4} & & A_{1,N-1} & A_{1,N} \\ 0 & 1 & 0 & 1 & \cdots & 0 & 0 \\ A_{2,1} & A_{2,2} & A_{2,3} & A_{2,4} & & A_{2,N-1} & A_{2,N} \\ \vdots & \vdots & \vdots & \vdots & & \vdots & \vdots \\ 0 & 0 & 1 & 0 & \cdots & 0 & 1 \\ A_{M-1,1} & A_{M-1,2} & A_{M-1,3} & A_{M-1,4} & & A_{M-1,N-1} & A_{M-1,N} \\ 1 & 0 & 0 & 0 & & 0 & 1 \\ A_{M,1} & A_{M,2} & A_{M,3} & A_{M,4} & & A_{M,N-1} & A_{M,N} \end{bmatrix}$$

FIG. 6

| EDGE OF $CN_M$ | Cycle 6 | Cycle 8 |
|---|---|---|
| FIRST EDGE | 4 | 8 |
| SECOND EDGE | 4 | 6 |
| THIRD EDGE | 6 | 6 |
| FOURTH EDGE | 8 | 6 |

FIG. 7

$$H = \begin{bmatrix} 1_{A_{1,1}} & 0_{A_{1,2}} & 1_{A_{1,3}} & 0_{A_{1,4}} & \cdots & 0_{A_{1,N-1}} & 0_{A_{1,N}} \\ 0_{A_{2,1}} & 1_{A_{2,2}} & 0_{A_{2,3}} & 1_{A_{2,4}} & \cdots & 0_{A_{2,N-1}} & 0_{A_{2,N}} \\ \vdots & \vdots & \vdots & \vdots & & \vdots & \vdots \\ 0_{A_{M-1,1}} & 0_{A_{M-1,2}} & 1_{A_{M-1,3}} & 0_{A_{M-1,4}} & \cdots & 0_{A_{M-1,N-1}} & 1_{A_{M-1,N}} \\ 1_{A_{M,1}} & 0_{A_{M,2}} & 0_{A_{M,3}} & 0_{A_{M,4}} & \cdots & 0_{A_{M,N-1}} & \boxed{0}_{A_{M,N}} \end{bmatrix}$$

FIG. 8

| EDGE OF $CN_M$ | Cycle 6 | Cycle 8 |
|---|---|---|
| FIRST EDGE | 8 | 8 |
| SECOND EDGE | 4 | 6 |
| THIRD EDGE | 6 | 10 |
| FOURTH EDGE | 8 | 6 |

FIG. 9

$$H = \begin{bmatrix} 1_{A_{1,1}} & 0_{A_{1,2}} & 1_{A_{1,3}} & 0_{A_{1,4}} & \cdots & 0_{A_{1,N-1}} & 0_{A_{1,N}} \\ 0_{A_{2,1}} & 1_{A_{2,2}} & 0_{A_{2,3}} & 1_{A_{2,4}} & \cdots & 0_{A_{2,N-1}} & 0_{A_{2,N}} \\ \vdots & \vdots & \vdots & \vdots &  & \vdots & \vdots \\ 0_{A_{M-1,1}} & 0_{A_{M-1,2}} & 1_{A_{M-1,3}} & 0_{A_{M-1,4}} & \cdots & 0_{A_{M-1,N-1}} & 1_{A_{M-1,N}} \\ 0_{A_{M,1}} & 0_{A_{M,2}} & 0_{A_{M,3}} & 0_{A_{M,4}} & \cdots & 0_{A_{M,N-1}} & 1_{A_{M,N}} \end{bmatrix}$$

FIG. 10

$$H = \begin{bmatrix} \begin{array}{cccccc} 1 & 0 & 1 & 0 & \cdots & 0 \\ A_{1,1} & A_{1,2} & A_{1,3} & A_{1,4} & & A_{1,N-1} & A_{1,N} \\ 0 & 1 & 0 & 1 & \cdots & 0 \\ A_{2,1} & A_{2,2} & A_{2,3} & A_{2,4} & & A_{2,N-1} & A_{2,N} \\ 0 & 0 & 0 & 1 & \cdots & 0 \\ A_{3,1} & A_{3,2} & A_{3,3} & A_{3,4} & & A_{3,N-1} & A_{3,N} \\ 0 & 0 & 0 & 0 & \cdots & 0 \\ A_{4,1} & A_{4,2} & A_{4,3} & A_{4,4} & & A_{4,N-1} & A_{4,N} \\ 0 & 0 & 0 & 1 & \cdots & 0 \\ A_{5,1} & A_{5,2} & A_{5,3} & A_{5,4} & & A_{5,N-1} & A_{5,N} \\ & & & \vdots & & \\ 0 & 0 & 1 & 0 & \cdots & 1 \\ A_{M-1,1} & A_{M-1,2} & A_{M-1,3} & A_{M-1,4} & & A_{M-1,N-1} & A_{M-1,N} \\ 1 & 0 & 0 & 0 & \cdots & 1 \\ A_{M,1} & A_{M,2} & A_{M,3} & A_{M,4} & & A_{M,N-1} & A_{M,N} \end{array} \end{bmatrix}$$

FIRST GROUP

SECOND GROUP

FIG. 11A

|  | Cycle 6 | Cycle 8 |
|---|---|---|
| CIRCULANT MATRIX OF $A_{5,4}$ | 0 | 8 |
| ... | ... | ... |
| ... | ... | ... |
| CIRCULANT MATRIX OF $A_{5,N-1}$ | 2 | 6 |

FIG. 11B

|  | Cycle 6 | Cycle 8 |
|---|---|---|
| CIRCULANT MATRIX OF $A_{M,1}$ | 8 | 8 |
| ... | ... | ... |
| ... | ... | ... |
| CIRCULANT MATRIX OF $A_{M,N}$ | 8 | 6 |

FIG. 12

| | A1,1 | A1,2 | A1,3 | A1,4 | ... | A1,N-1 | A1,N |
|---|---|---|---|---|---|---|---|
| | 1 | 0 | 1 | 0 | ... | 0 | 0 |
| | A2,1 | A2,2 | A2,3 | A2,4 | ... | A2,N-1 | A2,N |
| | 0 | 1 | 0 | 1 | ... | 0 | 0 |
| | A3,1 | A3,2 | A3,3 | A3,4 | ... | A3,N-1 | A3,N |
| | 0 | 0 | 1 | 1 | ... | 0 | 0 |
| | A4,1 | A4,2 | A4,3 | A4,4 | ... | A4,N-1 | A4,N |
| | 0 | 0 | 0 | 0 | ... | 1 | 0 |
| | A5,1 | A5,2 | A5,3 | A5,4 | ... | A5,N-1 | A5,N |
| | 0 | 0 | 0 | 1 | ... | 0 | 0 |
| | ... | ... | ... | ... | ... | ... | ... |
| | AM-1,1 | AM-1,2 | AM-1,3 | AM-1,4 | ... | AM-1,N-1 | AM-1,N |
| | 0 | 0 | 0 | 0 | ... | 0 | 1 |
| | AM,1 | AM,2 | AM,3 | AM,4 | ... | AM,N-1 | AM,N |
| | 0 | 0 | 0 | 0 | ... | 0 | 1 |

H =

FIRST GROUP
SECOND GROUP

CIRCUIT FOR TRANSFORMING PARITY-CHECK MATRIX OF QC-LDPC CODE, ERROR CORRECTION CIRCUIT HAVING THE SAME, AND METHOD OF OPERATING THE SAME

CROSS-REFERENCE TO RELATED APPLICATION

The present application claims priority under 35 U.S.C. § 119(a) to Korean patent application number 10-2018-0051975, filed on May 4, 2018, which is incorporated herein by reference in its entirety.

BACKGROUND

1. Field of Invention

Various embodiments of the present disclosure generally relate to a circuit for transforming a parity-check matrix of a Quasi-Cyclic Low-Density Parity-Check (QC-LDPC) code, an error correction circuit having the parity-check matrix transformation circuit, and a method of operating the parity-check matrix transformation circuit.

2. Description of Related Art

A memory system may store data received from an external device, and may provide stored data to the external device. The memory system may include an error correction circuit to guarantee the reliability of data. The error correction circuit may perform error correction encoding and error correction decoding using an error correction code.

A low-density parity-check (LDPC) code is a strong error correction code. This is due to the characteristics of an LDPC iterative decoding scheme in which, as the length of a code is increased, error correction capability per bit is improved, whereas computational complexity per bit is maintained without change. An LDPC code having a parity-check matrix that is configured using an array of k×k zero matrices or circulant matrices is referred to as a "Quasi-Cyclic Low-Density Parity-Check (QC-LDPC) code".

SUMMARY

Various embodiments of the present disclosure are directed to a parity-check matrix transformation circuit capable of transforming a parity-check matrix of a QC-LDPC code, an error correction circuit having the parity-check matrix transformation circuit, and a method of operating the parity-check matrix transform circuit.

An embodiment of the present disclosure may provide for a circuit for transforming a parity-check matrix of a Quasi-Cyclic Low-Density Parity-Check (QC-LDPC) code including circulant matrices. The circuit may include a determination component configured to determine whether a parity-check matrix that is externally input has full rank, a selection component configured to detect linearly dependent rows or columns, among rows or columns of the parity-check matrix, based on a result of the determination of the determination component, and select any one row or column from among the linearly dependent rows or columns, and an entry replacement component configured to replace any one of circulant matrices included in the selected one row or column with a zero matrix.

An embodiment of the present disclosure may provide for a method of transforming a parity-check matrix of a Quasi-Cyclic Low-Density Parity-Check (QC-LDPC) code including circulant matrices. The method may include determining whether a parity-check matrix that is externally input has full rank, detecting linearly dependent rows or columns, among rows or columns of the parity-check matrix based on a result of the determination, and selecting any one row or column from among the linearly dependent rows or columns, and replacing any one of circulant matrices included in the selected one row or column with a zero matrix.

An embodiment of the present disclosure may provide for an error correction circuit for performing error correction decoding using a parity-check matrix of a Quasi-Cyclic Low-Density Parity-Check (QC-LDPC) code including circulant matrices. The error correction circuit may include a parity-check matrix transformation circuit configured to determine whether a parity-check matrix that is externally input has full rank, detect linearly dependent rows or columns, among rows or columns of the parity-check matrix based on a result of the determination, select any one row or column from among the linearly dependent rows or columns, and replace any one of circulant matrices included in the selected one row or column with a zero matrix, and an error correction decoder configured to perform error correction decoding using a parity-check matrix in which the one circulant matrix is replaced with a zero matrix.

BRIEF DESCRIPTION OF THE DRAWINGS

FIG. 1A is a diagram illustrating a circuit for transforming a parity-check matrix of a QC-LDPC code according to an embodiment of the present disclosure.

FIG. 1B is a diagram illustrating a circuit for transforming a parity-check matrix of a QC-LDPC code according to an embodiment of the present disclosure.

FIGS. 2A and 2B are diagrams for explaining a parity-check matrix of a QC-LDPC code.

FIG. 4 is a diagram for explaining an example in which any one of linearly dependent rows is selected according to an embodiment of the present disclosure.

FIGS. 6 and 7 are diagrams for explaining an example in which a circulant matrix corresponding to an edge in the Tanner graph of FIG. 5 is replaced with a zero matrix.

FIGS. 8 and 9 are diagrams for explaining an example in which a circulant matrix corresponding to an edge in the Tanner graph of FIG. 5 is replaced with a zero matrix.

FIG. 10 is a diagram for explaining an example in which any one row is selected from each of groups including linearly dependent rows according to an embodiment of the present disclosure.

FIGS. 11A, 11B, and 12 are diagrams illustrating examples in which any one of circulant matrices included in each of a first group and a second group illustrated in FIG. 10 is replaced with a zero matrix.

DETAILED DESCRIPTION

Figure 3:
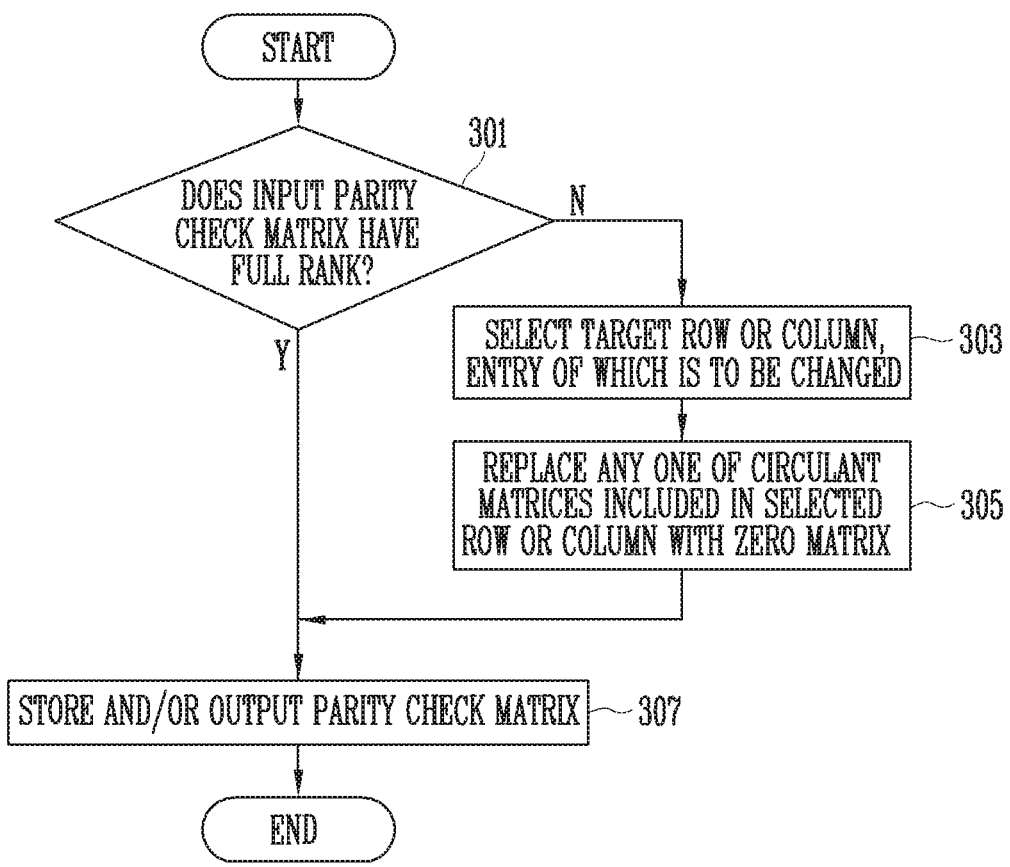
FIG. 3 is a flowchart illustrating a method of transforming a parity-check matrix according to an embodiment of the present disclosure.

Advantages and features of the present disclosure, and methods for achieving the same will be become more apparent with reference to embodiments described later in detail together with the accompanying drawings. The present disclosure is not limited to the following embodiments but embodied in other forms. Rather, these embodiments are provided so that the present disclosure will be thorough and complete, and will fully convey the technical spirit of the disclosure to those skilled in the art.

It will be understood that, although the terms "first" and/or "second" may be used herein to describe various elements, these elements should not be limited by these terms. These terms are only used to distinguish one element, from another element. For instance, a first element discussed below could be termed a second element without departing from the teachings of the present disclosure. Similarly, the second element could also be termed the first element.

The terminology used herein is for the purpose of describing particular embodiments only and is not intended to be limiting. In the present disclosure, the singular forms are intended to include the plural forms as well, unless the context clearly indicates otherwise. It will be further understood that the terms "comprise", "include", "have", etc. when used in this specification, specify the presence of stated features, numbers, steps, operations, elements, components, and/or combinations of them but do not preclude the presence or addition of one or more other features, numbers, steps, operations, elements, components, and/or combinations thereof.

It is also noted that in this specification, "connected/ coupled" refers to one component not only directly coupling another component but also indirectly coupling another component through an intermediate component. In the specification, when an element is referred to as "comprising" or "including" a component, it does not preclude another component but may further include other components unless the context clearly indicates otherwise.

Hereinafter, embodiments of the present disclosure will be described with reference to the attached drawings.

FIG. 1A is a diagram illustrating a circuit 100a for transforming a parity-check matrix of a QC-LDPC code according to an embodiment of the present disclosure.

Referring to FIG. 1A, the circuit 100a (hereinafter, also referred to as a "parity-check matrix transformation circuit 100a") for transforming a parity-check matrix of a QC-LDPC code may include a determination component 110a, a selection component 120a, an entry replacement component 130a, and a matrix storage component 140a.

The parity-check matrix transformation circuit 100a may receive a parity-check matrix of a QC-LDPC code which is externally input. Hereinafter, the parity check matrix may refer to the parity-check matrix of a QC-LDPC code. The parity-check matrix transformation circuit 100a may transform the input parity-check matrix. For example, the parity-check matrix transformation circuit 100a may change at least one entry of the input parity-check matrix. When the input parity-check matrix does not have full rank, the parity-check matrix transformation circuit 100a may generate a parity-check matrix having full rank by changing the entry of the input parity-check matrix. The externally-input parity-check matrix may be a parity-check matrix designed to have predetermined error correction capability.

The determination component 110a may determine whether the externally-input parity-check matrix has full rank. The determination of whether the parity-check matrix has full rank may be performed based on rows or columns of the parity-check matrix. That is, the determination component 110a may determine whether the input parity-check matrix has full rank by calculating a rank based on the rows of the parity-check matrix, or may determine whether the input parity-check matrix has full rank by calculating a rank based on the columns of the parity-check matrix. For the calculation of the rank, various algorithms such as Gauss-Jordan elimination may be used. When the parity-check matrix is a square matrix, an algorithm such as singular value decomposition (SVD) or QR decomposition may also be used. The algorithm used for the calculation of the rank is not limited to the above-described examples.

When the input parity-check matrix has full rank, the determination component 110a may store the input parity-check matrix in the matrix storage component 140a. When the input parity-check matrix does not have full rank, the determination component 110a may notify the selection component 120a of such a result.

The selection component 120a may select a target row or column, the entry of which is to be changed, from among the rows or columns of the party check matrix based on the result of determination by the determination component 110a. For example, when the determination component 110a determines that the parity-check matrix does not have full rank based on the rows of the parity-check matrix, the selection component 120a may select a target row, the entry of which is to be changed, from among the rows of the parity-check matrix. For example, when the determination component 110a determines that the parity-check matrix does not have full rank based on the columns of the parity-check matrix, the selection component 120a may select a target column, the entry of which is to be changed, from among the columns of the parity-check matrix.

In order to select a target row or column, the entry of which is to be changed, the selection component 120a may detect linearly dependent rows, among the rows of the parity-check matrix, or may detect linearly dependent columns, among the columns of the parity-check matrix. For the detection of linearly dependent rows or columns, various algorithms such as Gauss-Jordan elimination may be used. When the parity-check matrix is a square matrix, an algorithm such as singular value decomposition (SVD) or QR decomposition may also be used. The algorithm used for the detection of linearly dependent rows or columns is not limited to the above-described examples.

The selection component 120a may select any one of the linearly dependent rows as the target row, or may select any one of the linearly dependent columns as the target column. For example, the selection component 120a may select the last row, the first row, or any one row disposed between the first row and the last row, from among the linearly dependent rows. Similarly, the selection component 120a may select the last column, the first column, or any one column disposed between the first column and the last column, from among the linearly dependent columns.

For example, suppose that there is a '5×10' parity-check matrix having a rank of '4'. Further, suppose that the sum of elements in a first row and a third row is equal to an element in a fifth row, the first row, the third row, and the fifth row may be considered to be linearly dependent. In such a case, the selection component 120a may select any one of the first, third, and fifth rows as the target row. For example, the selection component 120a may select the fifth row which is the last row from among the first, third and fifth rows, as the target row.

In an embodiment of the present disclosure, when there is a plurality of groups for linearly dependent rows, among the rows of the parity-check matrix, the selection component 120a may select a target row, from each of the groups. Alternatively, when there are a plurality of groups for linearly dependent columns, among the columns of the parity-check matrix, the selection component 120a may select a target column, from each of the groups.

For example, suppose that there is a '7×14' parity-check matrix having a rank of '5'. Further, suppose that a first row, a third row, and a fifth row are linearly dependent, and a second row, a fourth row, and a sixth row are linearly dependent. In such a case, the selection component 120a may select any one row from a first group including the first, third, and fifth rows, and any one row from a second group including the second, fourth, and sixth rows, as target rows, the entry of which is to be changed. For example, the selection component 120a may select the fifth row from the first group as the target row, and may select the sixth row from the second group as the target row.

The entry replacement component 130a may select any one circulant matrix from among circulant matrices included in the target row or column, and may replace the selected circulant matrix with a zero matrix. The parity-check matrix in which any one circulant matrix is replaced with a zero matrix may be a parity-check matrix having full rank.

In an embodiment of the present disclosure, the entry replacement component 130a may replace a circulant matrix corresponding to a predetermined cycle, among the circulant matrices included in the target row or column, with a zero matrix. The predetermined cycle may be set differently according to the embodiment.

In an embodiment of the present disclosure, the predetermined cycle may be a girth of the parity-check matrix or an even number of '6' or more. That is, the entry replacement component 130a may replace a circulant matrix corresponding to the girth, among the circulant matrices included in the target row or column, with a zero matrix, or may replace a circulant matrix corresponding to a specific cycle with a zero matrix.

For example, suppose that there is a parity-check matrix having a girth of '6'. In such a case, when there is a circulant matrix corresponding to a cycle 6, among circulant matrices included in the target row or column, the entry replacement component 130a may replace the circulant matrix corresponding to the cycle 6 with a zero matrix.

In an embodiment of the present disclosure, the predetermined cycle may be a shortest cycle, among cycles to which circulant matrices included in the target row or column correspond. That is, the entry replacement component 130a may replace a circulant matrix corresponding to the shortest cycle, among the cycles to which the circulant matrices included in the target row or column correspond, with a zero matrix.

For example, suppose that there is a parity-check matrix having a girth of '6'. Further, suppose that, among the circulant matrices included in the target row or column, a circulant matrix corresponding to cycle 6 is not present, and one circulant matrix corresponding to cycle 8 is present. In such a case, the entry replacement component 130a may replace the circulant matrix corresponding to cycle 8 with a zero matrix.

In an embodiment of the present disclosure, when a plurality of circulant matrices, among the circulant matrices included in the target row or column correspond to the predetermined cycle, the entry replacement component 130a may replace any one of the plurality of circulant matrices with a zero matrix. For example, the entry replacement component 130a may replace any one of the plurality of circulant matrices with a zero matrix based on the number of times that each of the plurality of circulant matrices corresponds to the predetermined cycle. For example, the entry replacement component 130a may replace a circulant matrix corresponding most to the predetermined cycle, among the plurality of circulant matrices, with a zero matrix.

For example, suppose that the shortest cycle among cycles corresponding to the circulant matrices included in the target row is cycle 8. In such a case, when there are a plurality of circulant matrices corresponding to cycle 8, the entry replacement component 130a may replace a circulant matrix corresponding most to cycle 8, among the plurality of circulant matrices, with a zero matrix.

In an embodiment of the present disclosure, when there are a plurality of circulant matrices corresponding most to a predetermined cycle, among the circulant matrices included in the target row or column, the entry replacement component 130a may replace a circulant matrix corresponding most to a cycle subsequent to the predetermined cycle, among the plurality of circulant matrices, with a zero matrix.

For example, suppose that the shortest cycle among cycles corresponding to the circulant matrices included in the target row is cycle 8, and the second shortest cycle is cycle 10. Further, suppose that two circulant matrices correspond to cycle 8 the same number of times and the two circulant matrices correspond to cycle 8 a larger number of times than any other circulant matrices, and that the two circulant matrices correspond to cycle 10 different numbers of times. In such a case, the entry replacement component 130a may replace a circulant matrix corresponding more to cycle 10, of the two circulant matrices, with a zero matrix.

The matrix storage component 140a may store the parity-check matrix. The parity-check matrix stored in the matrix storage component 140a may be either an externally-input parity-check matrix or a parity-check matrix, in which some entries of the externally-input parity-check matrix are changed. For example, when the externally-input parity-check matrix has full rank, the matrix storage component 140a may store the externally-input parity-check matrix. For example, when the externally-input parity-check matrix does not have full rank, the matrix storage component 140a may store a parity-check matrix in which at least one entry is changed by the entry replacement component 130a. The parity-check matrix in which at least one entry is changed by the entry replacement component 130a may have full rank. The parity-check matrix stored in the matrix storage component 140a may be provided to an external device, and may then be used for error correction decoding using a QC-LDPC code.

FIG. 1B is a diagram illustrating a circuit for transforming a parity-check matrix of a QC-LDPC code according to an embodiment of the present disclosure.

Referring to FIG. 1B, a circuit 100b for transforming a parity-check matrix of a QC-LDPC code according to an embodiment of the present disclosure may include a determination component 110b, a selection component 120b, and an entry replacement component 130b.

The parity-check matrix transformation circuit 100b may receive a parity-check matrix of a QC-LDPC code which is externally input. The parity-check matrix transformation circuit 100b may transform the input parity-check matrix. For example, the parity-check matrix transformation circuit 100b may change at least one entry of the input parity-check matrix. When the input parity-check matrix does not have full rank, the parity-check matrix transformation circuit 100b may generate a parity-check matrix having full rank by changing the entry of the input parity-check matrix.

The determination component 110b may determine whether the externally-input parity-check matrix has full rank. The operation of the determination component 110b is identical to that of the determination component 110a, described above with reference to FIG. 1A, and thus a detailed description thereof will be omitted. However, unlike the operation of the determination component 110a, described above with reference to FIG. 1A, the determination component 110b may directly provide the input parity-check matrix to an external device which performs error correction decoding when the input parity-check matrix has full rank.

The selection component 120b may select a target row or column, the entry of which is to be changed, from among rows or columns of the party check matrix based on the result of determination by the determination component 110b. In order to select a target row or column, the entry of which is to be changed, the selection component 120b may detect linearly dependent rows among the rows of the parity-check matrix, or may detect linearly dependent columns among the columns of the parity-check matrix. The selection component 120b may select any one of the linearly dependent rows as the target row or may select any one of the linearly dependent columns as the target column. The operation of the selection component 120b is identical to that of the selection component 120a, described above with reference to FIG. 1A, and thus a detailed description thereof will be omitted.

The entry replacement component 130b may select any one circulant matrix from among circulant matrices included in the target row or column, and may replace the selected circulant matrix with a zero matrix. The operation of the entry replacement component 130b is identical to that of the entry replacement component 130a, described above with reference to FIG. 1A, and thus a detailed description thereof will be omitted. However, unlike the embodiment of FIG. 1A in which the parity-check matrix in which entries are changed is provided to the matrix storage component 140a, the entry replacement component 130b may directly provide the parity-check matrix in which entries are changed to the external device.

FIGS. 2A and 2B are diagrams for explaining a parity-check matrix of a QC-LDPC code.

In FIG. 2A, an 'M×N' parity-check matrix is illustrated. Here, 'M' and 'N' may each be an integer of '2' or more. The parity-check matrix may be composed of a plurality of sub-matrices. That is, each entry of the parity-check matrix may be a sub-matrix. Each entry of the parity-check matrix may be represented by '1' or '0'. '1' means that the corresponding entry is a circulant matrix, and '0' means that the corresponding entry is a zero matrix. For convenience of description, reference numeral $A_{m,n}$ has been assigned to an entry in an m-th row and an n-th column. That is, reference numeral $A_{m,n}$ indicates an entry in an m-th row and an n-th column.

In the parity-check matrix, an entry represented by '1' may indicate a 'k×k' circulant matrix. Here, 'k' may be an integer of '2' or more. The circulant matrix may be a matrix obtained by cyclically shifting an identity matrix by a predetermined shift value, and any one circulant matrix may have a shift value different from that of another circulant matrix. For example, as illustrated in FIG. 2B, an entry indicated by reference numeral $A_{1,1}$ may be a circulant matrix obtained by cyclically shifting the identity matrix to the right by '1' (i.e., a shift value is '1'), and an entry indicated by reference numeral $A_{M,3}$ may be a circulant matrix obtained by cyclically shifting the identity matrix to the right by '2' (i.e., a shift value is '2').

In the parity-check matrix, an entry represented by '0' may indicate a 'k×k' zero matrix. For example, as illustrated in FIG. 2B, an entry indicated by reference numeral $A_{1,2}$ may be a zero matrix. All entries in the parity-check matrix, that is, all circulant matrices and all zero matrices, may be square matrices having the same size.

FIG. 3 is a flowchart illustrating a method of transforming a parity-check matrix according to an embodiment of the present disclosure.

An embodiment to be described with reference to FIG. 3 may be applied to the parity-check matrix transformation circuit 100a and 100b, described above with reference to FIGS. 1A and 1B, respectively. In an embodiment of the present disclosure, at least one of the steps illustrated in FIG. 3 may be omitted.

At step 301, a determination component (such as the determination component 110a and 110b shown in FIGS. 1A and 1B, respectively) may determine whether a parity-check matrix that is externally input has full rank. For example, the determination component may determine whether the input parity-check matrix has full rank by calculating the rank based on rows of the parity-check matrix, or may determine whether the input parity-check matrix has full rank by calculating the rank based on columns of the parity-check matrix. When the input parity-check matrix has full rank (that is, "Y" at step 301), step 307 may be performed. When the input parity-check matrix does not have full rank (that is, "N" at step 301), step 303 may be performed.

At step 303, when the input-parity matrix does not have full rank, a selection component (such as the selection component 120a and 120b shown in FIGS. 1A and 1B, respectively) may select a target row or column, the entry of which is to be changed, from among the rows or columns of the parity-check matrix. For this operation, the selection component may detect linearly dependent rows or columns among the rows or columns of the parity-check matrix. That is, the selection component may detect linearly dependent rows among the rows of the parity-check matrix, or may detect linearly dependent columns among the columns of the parity-check matrix. Below, cases where the rank of a parity-check matrix that is capable of having full rank 'R' based on rows is 'R−1' and 'R−r' will be separately described. Here, 'R' is an integer that is equal to or greater than '2', and 'r' is an integer that is equal to or greater than '2' and is less than or equal to 'R'.

First, the case where the rank of the parity-check matrix that is capable of having full rank 'R' based on rows is 'R−1' will be described below. The fact that the rank of the parity-check matrix that is capable of having full rank R based on rows is 'R−1' means that the number of groups for linearly dependent rows is '1'. For example, a case where, among the rows of a 5×10 parity-check matrix having a rank of '4', a first row, a third row, and a fifth row are linearly dependent, and additional linearly dependent rows other than the corresponding rows are not present may be the case where the number of groups for linearly dependent rows is '1'. In this case, the selection component may select any one of the linearly dependent rows as the target row. For example, the selection component may select the fifth row that is the last row, the first row that is the initial row, or the third row that is a row disposed between the first and last rows, from among the linearly dependent rows.

Next, the case where the rank of the parity-check matrix that is capable of having full rank 'R' based on rows is 'R−r' will be described below. The fact that the rank of the parity-check matrix that is capable of having full rank 'R' based on rows is 'R−r' means that the number of groups for linearly dependent rows is 'r'. In this case, the selection component may select any one row from each of the 'r' groups as the target row. That is, when the number of groups for linearly dependent rows is 'r', a total of 'r' rows may be selected in such a way that one row is selected from each group.

At step 305, an entry replacement component (such as the entry replacement component 130a and 130b shown in FIGS. 1A and 1B, respectively) may select any one circulant matrix from among circulant matrices included in the target row or column selected by the selection component, and may replace the selected circulant matrix with a zero matrix. That is, the entry replacement component may replace any one of the circulant matrices included in the target row with a zero matrix, or may replace any one of the circulant matrices included in the target column with a zero matrix. The parity-check matrix in which any one circulant matrix is replaced with a zero matrix may be a parity-check matrix having full rank. As described above, the number of target rows, the entry of which is to be changed, may be plural. In this case, the entry replacement component may select any one circulant matrix from each of target rows or columns, and may replace the selected circulant matrices with zero matrices.

The entry replacement component may replace a circulant matrix corresponding to a predetermined cycle, among the circulant matrices included in each target row or column, the entry of which is to be changed, with a zero matrix. For example, the predetermined cycle may be a girth of the parity-check matrix or an even number of '6' or more. For example, the predetermined cycle may be a shortest cycle, among cycles to which circulant matrices included in the target row correspond.

When a plurality of circulant matrices, among the circulant matrices included in the target row or column correspond to the predetermined cycle, the entry replacement component may replace any one of the plurality of circulant matrices with a zero matrix. For example, the entry replacement component may replace any one of the plurality of circulant matrices with a zero matrix based on the number of times that each of the plurality of circulant matrices corresponds to the predetermined cycle. For example, the entry replacement component may replace a circulant matrix corresponding most to the predetermined cycle, among the plurality of circulant matrices, with a zero matrix.

When, among the circulant matrices included in the target row or column, the entry of which is to be changed, two or more circulant matrices correspond most to the predetermined cycle, the entry replacement component may replace a circulant matrix corresponding most to a cycle subsequent to the predetermined cycle, among the two or more circulant matrices, with a zero matrix.

At step 307, the parity-check matrix may be stored and/or output. The parity-check matrix, stored and/or output at step 307, may be either a parity-check matrix in which at least one entry is changed or a parity-check matrix in which no entry is changed. That is, the parity-check matrix, stored and/or output at step 307, may be either the externally-input parity-check matrix or a parity-check matrix in which a circulant matrix included in any one of rows or columns of the externally-input parity-check matrix is replaced with a zero matrix.

FIG. 4 is a diagram for explaining an example in which any one of linearly dependent rows is selected according to an embodiment of the present disclosure.

In FIG. 4, an M×N parity-check matrix is illustrated. Here, M and N may each be an integer of '2' or more.

As described above, a determination component (such as the determination component 110a and 110b shown in FIGS. 1A and 1B, respectively) may calculate the rank of the parity-check matrix, and a selection component (such as the selection component 120a and 120b shown in FIGS. 1A and 1B, respectively) may check (or detect) linearly dependent rows, among rows of the parity-check matrix. For the calculation of the rank and the checking of linearly dependent rows, various algorithms such as Gauss-Jordan elimination may be used. In an embodiment to be described with reference to FIG. 4, it is assumed that the rank of the parity-check matrix is calculated as 'M−1' and that a first row, an (M−1)-th row, and an M-th row are found to be linearly dependent.

The selection component may select any one of the first, (M−1)-th, and M-th rows which are linearly dependent as a target row, the entry of which is to be changed. For example, the selection component may select the M-th row that is the last row, the first row that is the initial row, or the (M−1)-th row that is disposed between the first and M-th rows, from among the linearly dependent rows.

Once the target row is selected, a circulant matrix to be replaced with a zero matrix should be selected from among the circulant matrices included in the selected row. Below, for convenience of description, examples in which a circulant matrix to be replaced with a zero matrix is selected using a Tanner graph of a parity-check matrix will be described. However, for the selection of a circulant matrix to be replaced with a zero matrix, various methods may be used in addition to the method using a Tanner graph, and the present disclosure is not limited to the use of a Tanner graph.

Figure 5:
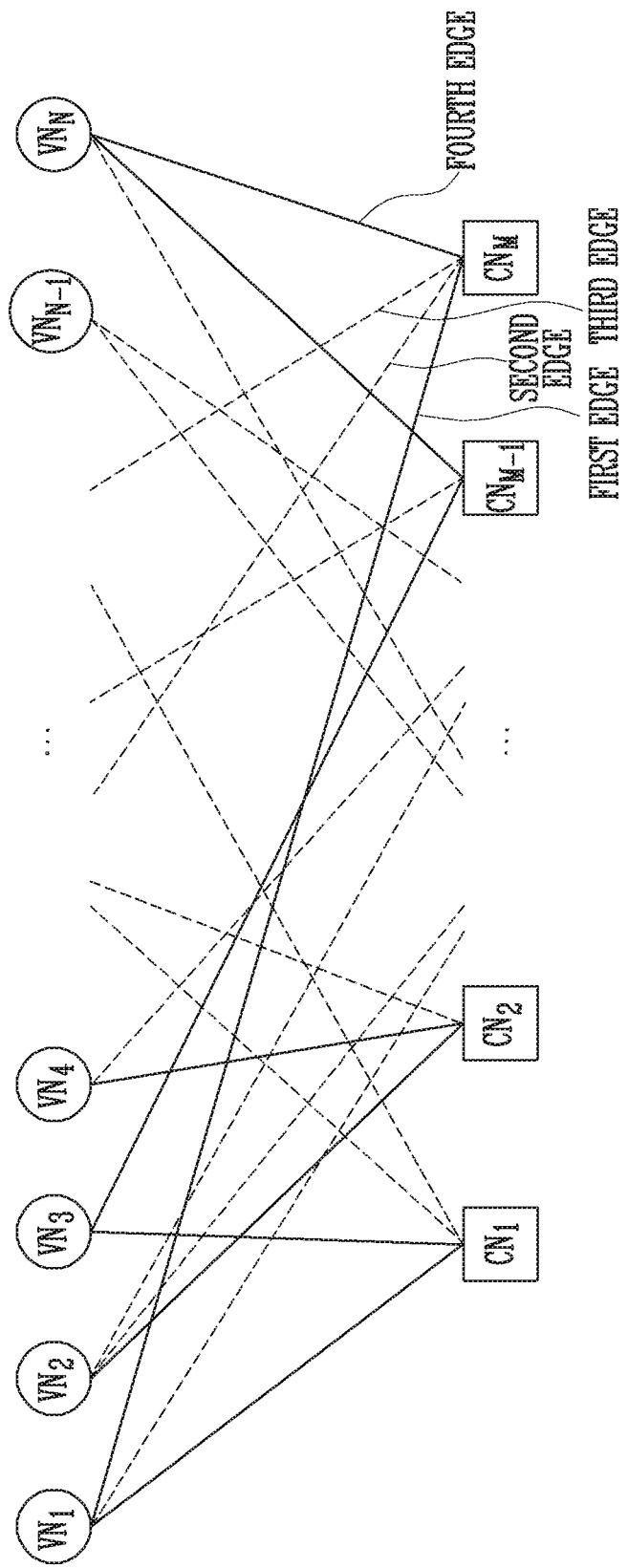
FIG. 5 is a diagram illustrating a parity-check matrix of FIG. 4 as a Tanner graph.

FIG. 5 is a diagram illustrating the parity-check matrix of FIG. 4 as a Tanner graph.

An LDPC code may be represented by a Tanner graph which is an expression of an equivalent bipartite graph. A Tanner graph may be represented by check nodes $CN_1$ to $CN_M$, variable nodes $VN_1$ to $VN_N$, and edges (indicated by dotted lines and solid lines). Here, 'M' and 'N' may each be an integer of '2' or more. The check nodes $CN_1$ to $CN_M$ may indicate respective rows of the parity-check matrix, and the variable nodes $VN_1$ to $VN_N$ may indicate respective columns of the parity-check matrix. Each edge couples one check node to one variable node and indicates a circulant matrix represented by '1' in the parity-check matrix.

In the embodiment described above with reference to FIG. 4, assuming that the M-th row is selected as the target row, the entry of which is to be changed, a check node corresponding to the M-th row in FIG. 5 is a check node $CN_M$, and first to fourth edges indicate circulant matrices included in the M-th row. For example, the first edge indicates a circulant matrix in the M-th row and the first column of the parity-check matrix, and the fourth edge indicates a circulant matrix in the M-th row and the N-th column of the parity-check matrix. The second edge and the third edge indicate circulant matrices disposed between the M-th row and the first column and the M-th row and the N-th column.

For each of the first to fourth edges, cycles to which the edges correspond and the number of times that each edge corresponds to the relevant cycle may be calculated. This means that the cycles to which respective circulant matrices, included in the parity-check matrix, correspond and the number of times that each circulant matrix corresponds to the relevant cycle may be calculated. The cycles to which respective circulant matrices correspond and the number of times that each circulant matrix corresponds to the relevant cycle may be calculated using various conventional methods. For example, all possible paths departing from an arbitrary node and arriving at the arbitrary node in a Tanner graph may be calculated, and the number of edges included in each calculated path indicates a cycle. Therefore, when all paths passing through a certain edge coupled to the arbitrary node are checked, the cycle to which the certain edge corresponds and the number of times that the certain edge corresponds to the cycle may be calculated.

FIGS. 6 and 7 are diagrams for explaining an example in which a circulant matrix corresponding to an edge in the Tanner graph of FIG. 5 is replaced with a zero matrix.

In FIG. 6, shows the numbers of times that first to fourth edges illustrated in FIG. 5 correspond to cycle 6 and cycle 8.

As described above, when there are a plurality of circulant matrices corresponding to a predetermined cycle, the entry replacement component (such as the entry replacement component 130a and 130b shown in FIGS. 1A and 1B, respectively) may replace a circulant matrix corresponding most to the predetermined cycle, among the plurality of circulant matrices, with a zero matrix.

Assuming that the predetermined cycle is cycle 6, an edge corresponding most to the cycle 6, among the first to fourth edges, is the fourth edge. Therefore, the entry replacement component may select a circulant matrix corresponding to the fourth edge, and may replace the selected circulant matrix with a zero matrix. Referring to FIGS. 4 and 5, it can be seen that the fourth edge of the check node $CN_M$ is a circulant matrix in an M-th row and an N-th column. Therefore, the entry replacement component may replace the circulant matrix in the M-th row and the N-th column with a zero matrix. Referring to FIG. 7, it can be seen that the circulant matrix in the M-th row and the N-th column illustrated in FIG. 4 is replaced with a zero matrix.

FIGS. 8 and 9 are diagrams for explaining an example in which a circulant matrix corresponding to an edge in the Tanner graph of FIG. 5 is replaced with a zero matrix.

FIG. 8 shows the number of times that first to fourth edges illustrated in FIG. 5 correspond to cycle 6 and cycle 8.

As described above, when there are a plurality of circulant matrices corresponding most to a predetermined cycle, the entry replacement component may replace a circulant matrix corresponding most to a cycle subsequent to the predetermined cycle, among the plurality of circulant matrices, with a zero matrix.

Assuming that the predetermined cycle is cycle 6, edges corresponding most to cycle 6, among the first to fourth edges, are the first edge and the fourth edge. Therefore, the entry replacement component may check an edge corresponding most to cycle 8, which is a cycle subsequent to cycle 6, of the first edge and the fourth edge. Referring to FIG. 8, it can be seen that the first edge corresponds eight times to cycle 8 and the fourth edge corresponds six times to cycle 8. Therefore, the entry replacement component may select a circulant matrix corresponding to the first edge, and may replace the selected circulant matrix with a zero matrix. Referring to FIGS. 4 and 5, it can be seen that the first edge of the check node $CN_M$ is a circulant matrix in the M-th row and the first column. Therefore, the entry replacement component may replace the circulant matrix in the M-th row and the first column with a zero matrix. Referring to FIG. 9, it can be seen that the circulant matrix in the M-th row and the first column illustrated in FIG. 4 has been replaced with a zero matrix.

FIG. 10 is a diagram for explaining an example in which any one row is selected from each of groups including linearly dependent rows according to an embodiment of the present disclosure.

In FIG. 10, an 'M×N' parity-check matrix is illustrated. Here, 'M' and 'N' may each be an integer of '2' or more.

As described above, a determination component may calculate the rank of the parity-check matrix, and a selection component may check (or detect) linearly dependent rows, among rows of the parity-check matrix. For the calculation of the rank and the checking of linearly dependent rows, various algorithms such as Gauss-Jordan elimination may be used. In an embodiment to be described with reference to FIG. 10, it is assumed that the rank of a parity-check matrix is calculated as 'M−2' and the number of groups for linearly dependent rows is found to be '2'. Also, it is assumed that a first group includes a first row, an (M−1)-th row, and an M-th row, and a second group includes a third row, a fourth row, and a fifth row.

The selection component may select a row, the entry of which is to be changed, from each of the groups. That is, the selection component may select any one of the first, (M−1)-th, and M-th rows included in the first group as a target row, the entry of which is to be changed, and may select any one of the third, fourth, and fifth rows included in the second group as a target row, the entry of which is to be changed.

For example, the selection component may select the M-th row, which is the last row, from among the rows included in the first group, and may select the fifth row, which is the last row, among the rows included in the second group.

FIGS. 11A, 11B, and 12 are diagrams illustrating examples in which any one of circulant matrices included in each of a first group and a second group illustrated in FIG. 10 is replaced with a zero matrix.

In an embodiment to be described with reference to FIG. 11A, a case where the fifth row, which is the last row, among rows included in the second group illustrated in FIG. 10, is selected is assumed. FIG. 11A illustrates the number of times that circulant matrices included in the fifth row correspond to cycle 6 and cycle 8.

As described above, the entry replacement component may select a circulant matrix corresponding to a predetermined cycle, and may replace the selected circulant matrix with a zero matrix.

Assuming that the predetermined cycle is cycle 6 and only a circulant matrix of $A_{5,N-1}$ is present as a circulant matrix corresponding to cycle 6, among the circulant matrices included in the fifth row, the entry replacement component may replace the circulant matrix of $A_{5,N-1}$ with a zero matrix.

In an embodiment to be described with reference to FIG. 11B, a case where an M-th row, which is the last row, among rows included in the first group illustrated in FIG. 10, is selected is assumed. In FIG. 11B, the numbers of times that circulant matrices included in the M-th row correspond to cycle 6 and cycle 8 are illustrated.

As described above, when there are a plurality of circulant matrices corresponding most to a predetermined cycle, the entry replacement component may replace a circulant matrix corresponding most to a cycle subsequent to the predetermined cycle, among the plurality of circulant matrices, with a zero matrix.

Assuming that the predetermined cycle is cycle 6, circulant matrices corresponding most to cycle 6, among the circulant matrices included in the M-th row, are a circulant matrix of $A_{M,1}$ and a circulant matrix of $A_{M,N}$. Therefore, the entry replacement component may check a circulant matrix corresponding most to cycle 8, which is a cycle subsequent to cycle 6, of the circulant matrices of $A_{M,1}$ and $A_{M,N}$. Referring to FIG. 11B, it can be seen that the circulation matrix of $A_{M,1}$ corresponds eight times to cycle 8, and the circulation matrix of $A_{M,N}$ corresponds sixth times to cycle 8. Therefore, the entry replacement component may select the circulant matrix of $A_{M,1}$, and may replace the selected circulant matrix of $A_{M,1}$ with a zero matrix.

Referring to FIG. 12, it can be seen that the circulant matrix of $A_{5,N-1}$ and the circulant matrix of $A_{M,1}$, which are illustrated in FIG. 10, are replaced with zero matrices.

Figure 13A:
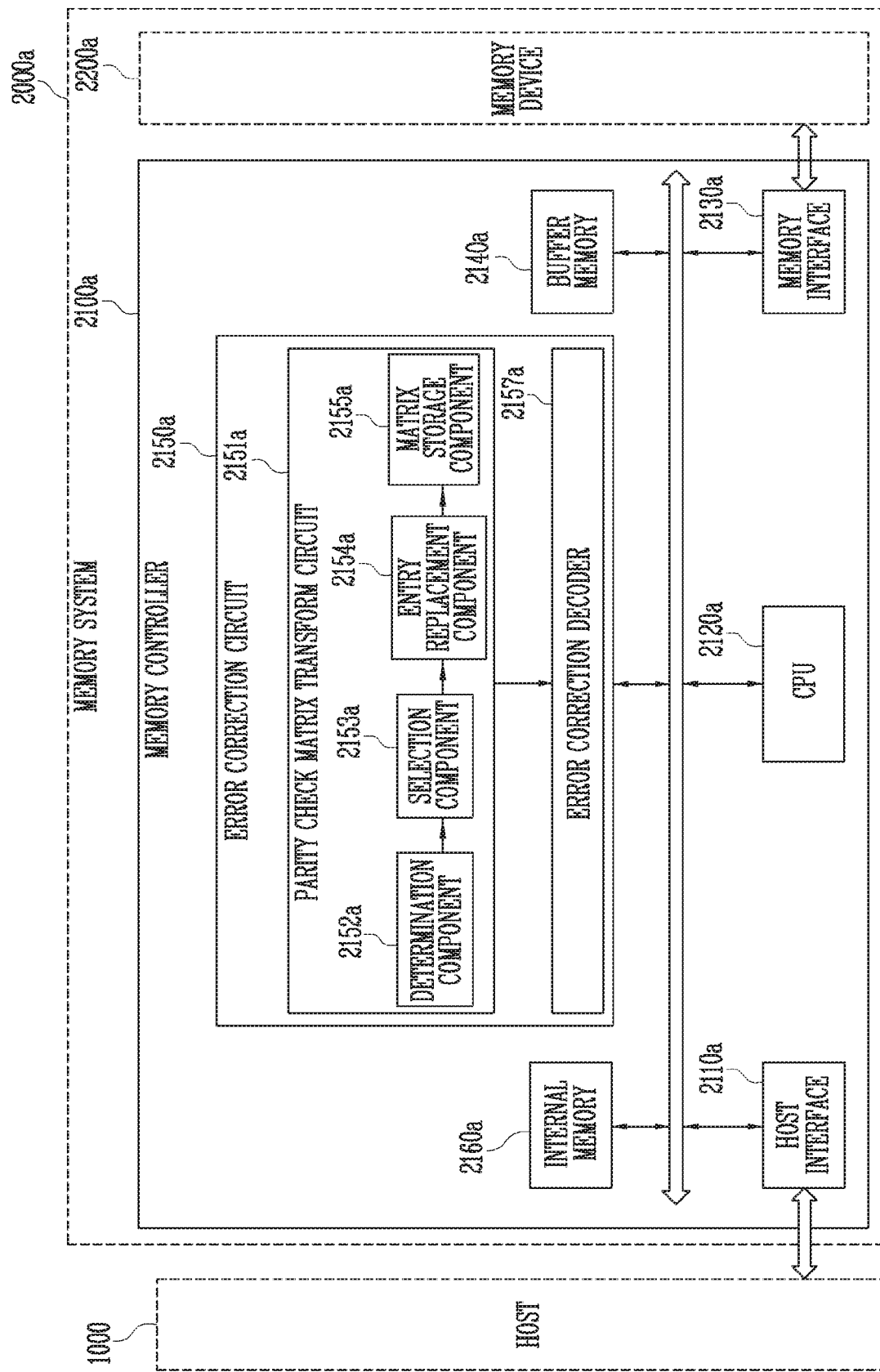
FIG. 13A is a diagram illustrating a memory system according to an embodiment of the present disclosure.

FIG. 13A is a diagram illustrating a memory system 2000a according to an embodiment of the present disclosure.

Referring to FIG. 13A, the memory system 2000a may include a memory device 2200a which stores data, and a memory controller 2100a which controls the memory device 2200a under the control of a host 1000.

The host 1000 may communicate with the memory system 2000a using an interface protocol, such as Peripheral Component Interconnect-Express (PCI-E), Advanced Technology Attachment (ATA), Serial ATA (SATA), Parallel ATA (PATA) or Serial Attached SCSI (SAS). Interface protocols used between the host 1000 and the memory system 2000a are not limited to the above-described examples, and an interface protocol, such as Universal Serial Bus (USB), Multi-Media Card (MMC), Enhanced Small Disk Interface (ESDI), or Integrated Drive Electronics (IDE), may be used.

The memory controller 2100a may control the overall operation of the memory system 2000a, and may control data exchange between the host 1000 and the memory device 2200a. For example, the memory controller 2100a may convert received information and store and output the converted information so that commands, addresses, and data may be communicated between the host 1000 and the memory device 2200a. During a program operation, the memory controller 2100a may transmit a command, an address, and data to the memory device 2200a.

The memory controller 2100a may include a host interface 2110a, a Central Processing Unit (CPU) 2120a, a memory interface 2130a, a buffer memory 2140a, an error correction circuit 2150a, and an internal memory 2160a. The host interface 2110a, the memory interface 2130a, the buffer memory 2140a, the error correction circuit 2150a, and the internal memory 2160a may be controlled by the CPU 2120a.

The host interface 2110a may perform data exchange with the host 1000 using a communication protocol.

The CPU 2120a may perform various types of calculations or generate commands and addresses so as to control the memory device 2200a. For example, the CPU 2120a may generate various commands required for a program operation, a read operation, an erase operation, a data compression operation, and copy-back operations.

The memory interface 2130a may communicate with the memory device 2200a using a communication protocol.

The buffer memory 2140a may temporarily store data while the memory controller 2100a controls the memory device 2200a. For example, until the program operation is completed, data received from the host may be temporarily stored in the buffer memory 2140a. Further, during a read operation, data read from the memory device 2200a may be temporarily stored in the buffer memory 2140a.

The error correction circuit 2150a may perform error correction encoding during a program operation, or may perform error correction decoding during a read operation. The error correction circuit 2150a may include a parity-check matrix transformation circuit 2151a and an error correction decoder 2157a.

The parity-check matrix transformation circuit 2151a may include a determination component 2152a, a selection component 2153a, an entry replacement component 2154a, and a matrix storage component 2155a. The parity-check matrix transformation circuit 2151a may perform the same operation as the parity-check matrix transformation circuit 100a, described above with reference to FIG. 1A. That is, the determination component 2152a, the selection component 2153a, the entry replacement component 2154a, and the matrix storage component 2155a of FIG. 13A may perform operations respectively corresponding to the determination component 110a, the selection component 120a, the entry replacement component 130a, and the matrix storage component 140a of FIG. 1A.

The error correction decoder 2157a may perform error correction decoding on data, corresponding to a codeword, read from the memory device 2200a using a parity-check matrix. The parity-check matrix that is used for error correction decoding may be either a parity-check matrix that is externally input to the error correction circuit 2150a, or a parity-check matrix in which some entries of the parity-check matrix, externally input to the error correction circuit 2150a, are changed. The error correction decoder 2157a may check whether an error is present in the read data when error correction decoding is performed, and may correct an error using the parity-check matrix when an error is detected. For example, the error correction decoder 2157a may calculate a syndrome corresponding to the read data based on the parity-check matrix, and may determine, based on the calculated syndrome, whether an error is contained in the read data. The error correction decoder 2157a may correct the error and output error-corrected data when the error contained in the read data is correctable. The error correction decoder 2157a may report a failure in error correction decoding to the CPU 2120a when the error contained in the read data is not correctable.

The internal memory 2160a may be used as a storage which stores various types of information required for the operation of the memory controller 2100a.

The memory device 2200a may perform a program operation, a read operation, an erase operation, a data compression operation, and a copy-back operation under the control of the memory controller 2100a. The memory device 2200a may be implemented as a volatile memory device in which stored data is lost when the supply of power is interrupted or as a nonvolatile memory device in which stored data is retained even when the supply of power is interrupted. In embodiments which will be described below, a flash memory included in the nonvolatile memory device is described by way of example. During a program operation, the memory device 2200a may program data or output stored data based on a command and an address.

Figure 13B:
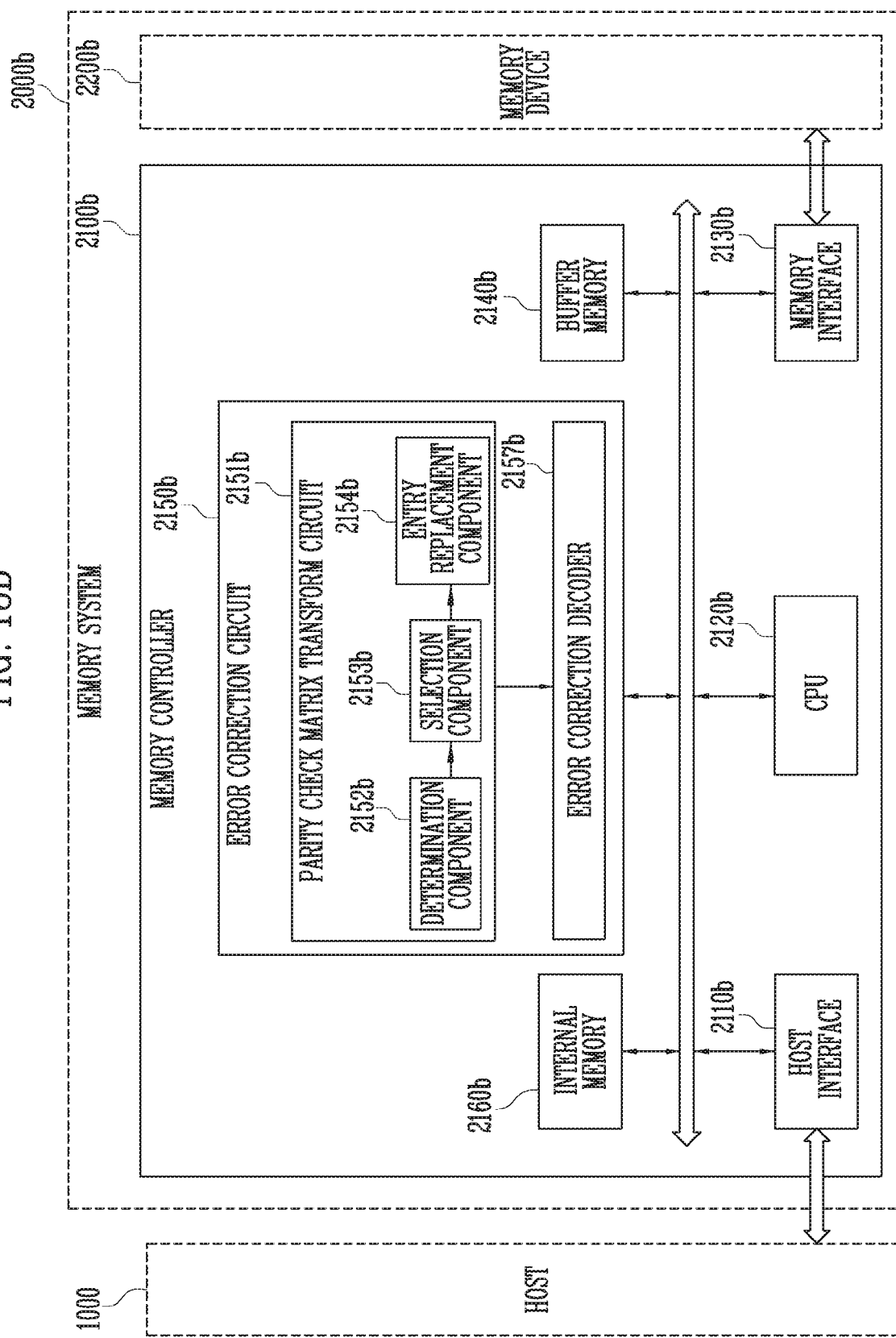
FIG. 13B is a diagram illustrating a memory system according to an embodiment of the present disclosure.

FIG. 13B is a diagram illustrating a memory system according to an embodiment of the present disclosure.

In an embodiment to be described with reference to FIG. 13B, a repeated description related to the embodiment of the present disclosure, described above with reference to FIG. 13A, will be omitted.

Referring to FIG. 13B, a memory system 2000b may include a memory device 2200b which stores data, and a memory controller 2100b which controls the memory device 2200b under the control of a host 1000.

The error correction circuit 2150b may perform error correction encoding during a program operation, or may perform error correction decoding during a read operation. The error correction circuit 2150b may include a parity-check matrix transformation circuit 2151b and an error correction decoder 2157b.

The parity-check matrix transformation circuit 2151b may include a determination component 2152b, a selection component 2153b, and an entry replacement component 2154b. The parity-check matrix transformation circuit 2151b may perform the same operation as the parity-check matrix transformation circuit 100b, described above with reference to FIG. 1B. That is, the determination component 2152b, the selection component 2153b, and the entry replacement component 2154b of FIG. 13B may perform the operations respectively corresponding to the determination component 110b, the selection component 120b, and the entry replacement component 130b of FIG. 1B.

The error correction decoder 2157b may perform error correction decoding on data, corresponding to a codeword, read from the memory device 2200b using a parity-check matrix.

The configuration of the embodiment of FIG. 13B is identical to that of the embodiment described with reference to FIG. 13A, except that a matrix storage component (such as the matrix storage component 2155a shown in FIG. 13A) is excluded. In the embodiment of FIG. 13B, a parity-check matrix in which entries are changed may be directly transmitted from the entry replacement component 2154b to the error correction decoder 2157b. In an embodiment of the present disclosure, the parity-check matrix may be stored in a separate storage space present in the error correction circuit 2150b, and may then be transmitted to the error correction decoder 2157b when a request is received from the error correction decoder 2157b.

Figure 14:
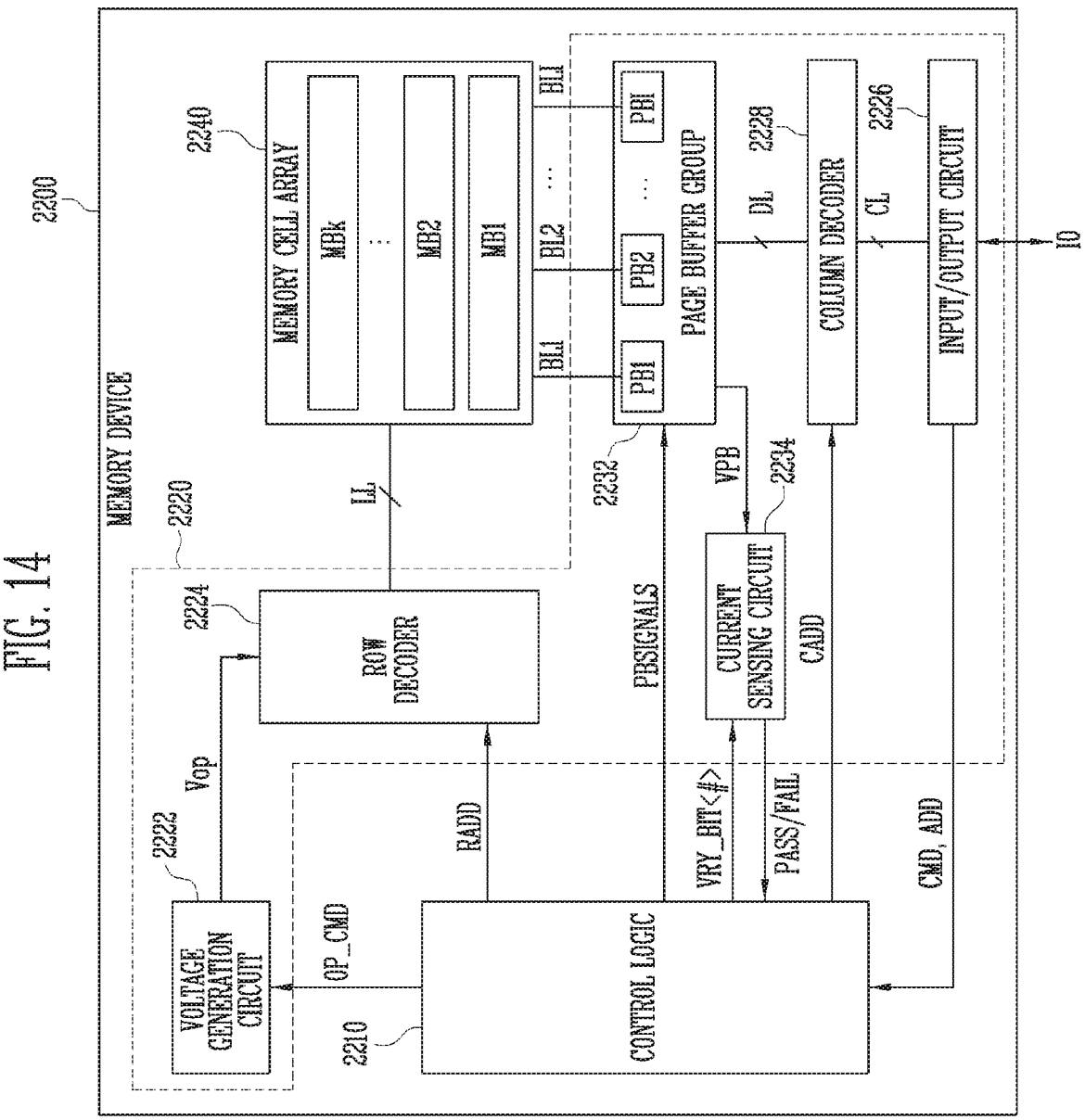
FIG. 14 is a diagram illustrating a memory device according to an embodiment of the present disclosure.

FIG. 14 is a diagram illustrating a memory device according to an embodiment of the present disclosure. The memory device illustrated in FIG. 14 may be applied to the memory system illustrated in FIGS. 13A and 13B.

The memory device 2200 may include a control logic 2210, peripheral circuits 2220, and a memory cell array 2240. The peripheral circuits 2220 may include a voltage generation circuit 2222, a row decoder 2224, an input/output circuit 2226, a column decoder 2228, a page buffer group 2232, and a current sensing circuit 2234.

The control logic 2210 may control the peripheral circuits 2220 under the control of the memory controller 2100a of FIG. 13A or the memory controller 2100b of FIG. 13B. The control logic 2210 may control the peripheral circuits 2220 in response to a command CMD and an address ADD that are received from the memory controller through the input/output circuit 2226. For example, the control logic 2210 may output an operation signal OP_CMD, a row address RADD, page buffer control signals PBSIGNALS, and an enable bit VRY_BIT<#> in response to the command CMD and the address ADD. The control logic 2210 may determine whether a verify operation has passed or failed in response to a pass or fail signal PASS or FAIL received from the current sensing circuit 2234.

The peripheral circuits 2220 may perform a program operation of storing data in the memory cell array 2240, a read operation of outputting data stored in the memory cell array 2240, and an erase operation of erasing data stored in the memory cell array 2240, under the control of the control logic 2210. Further, the peripheral circuits 2220 may perform a data compression operation of reducing data capacity using parity data, or a copy-back operation of copying data to another memory block.

The voltage generation circuit 2222 may generate various operating voltages Vop used for the program, read, and erase operations in response to the operation signal OP_CMD received from the control logic 2210. For example, the voltage generation circuit 2222 may generate a program voltage, a verify voltage, a pass voltage, a compensation program voltage, a read voltage, an erase voltage, a turn-on voltage, etc.

The row decoder 2224 may transfer the operating voltages Vop to local lines LL that are coupled to a memory block selected from among memory blocks included in the memory cell array 2240 in response to the row address RADD received from the control logic 2210. The local lines LL may include local word lines, local drain select lines, and local source select lines. In addition, the local lines LL may include various lines, such as source lines, coupled to memory blocks.

The input/output circuit 2226 may transfer the command CMD and the address ADD, received from the memory controller through input/output (IO) lines, to the control logic 2210, or may exchange data with the column decoder 2228.

The column decoder 2228 may transfer data between the input/output circuit 2226 and the page buffer group 2232 in response to a column address CADD received from the control logic 2210. For example, the column decoder 2228 may exchange data with the page buffers PB1 to PBI through data lines DL or may exchange data with the input/output circuit 2226 through column lines CL.

The page buffer group 2232 may be coupled to the bit lines BL1 to BLI that are coupled in common to the memory blocks included in the memory cell array 2240. The page buffer group 2232 may include a plurality of page buffers PB1 to PBI coupled to the bit lines BL1 to BLI. For example, a single page buffer may be coupled to each bit line. The page buffers PB1 to PBI may be operated in response to the page buffer control signals PBSIGNALS received from the control logic 2210. For example, during a program operation, the page buffers PB1 to PBI may temporarily store program data received from the memory controller, and may control voltages to be applied to the bit lines BL1 to BLI based on the program data. Also, during a read operation, the page buffers PB1 to PBI may temporarily store data received through the bit lines BL1 to BLI or may sense voltages or currents of the bit lines BL1 to BLI.

During a read operation or a verify operation, the current sensing circuit 2234 may generate a reference current in response to the enable bit VRY_BIT<#> received from the control logic 2210, and may compare a reference voltage, generated by the reference current, with a sensing voltage VPB, received from the page buffer group 2232, and then output a pass signal PASS or a fail signal FAIL.

The memory cell array 2240 may include a plurality of memory blocks MB1 to MBk which store data. In the memory blocks MB1 to MBk, user data and various types of information required for the operation of the memory device 2200 may be stored. The memory blocks MB1 to MBk may each be implemented as a two-dimensional (2D) structure or a three-dimensional (3D) structure, and may be equally configured.

Figure 15:
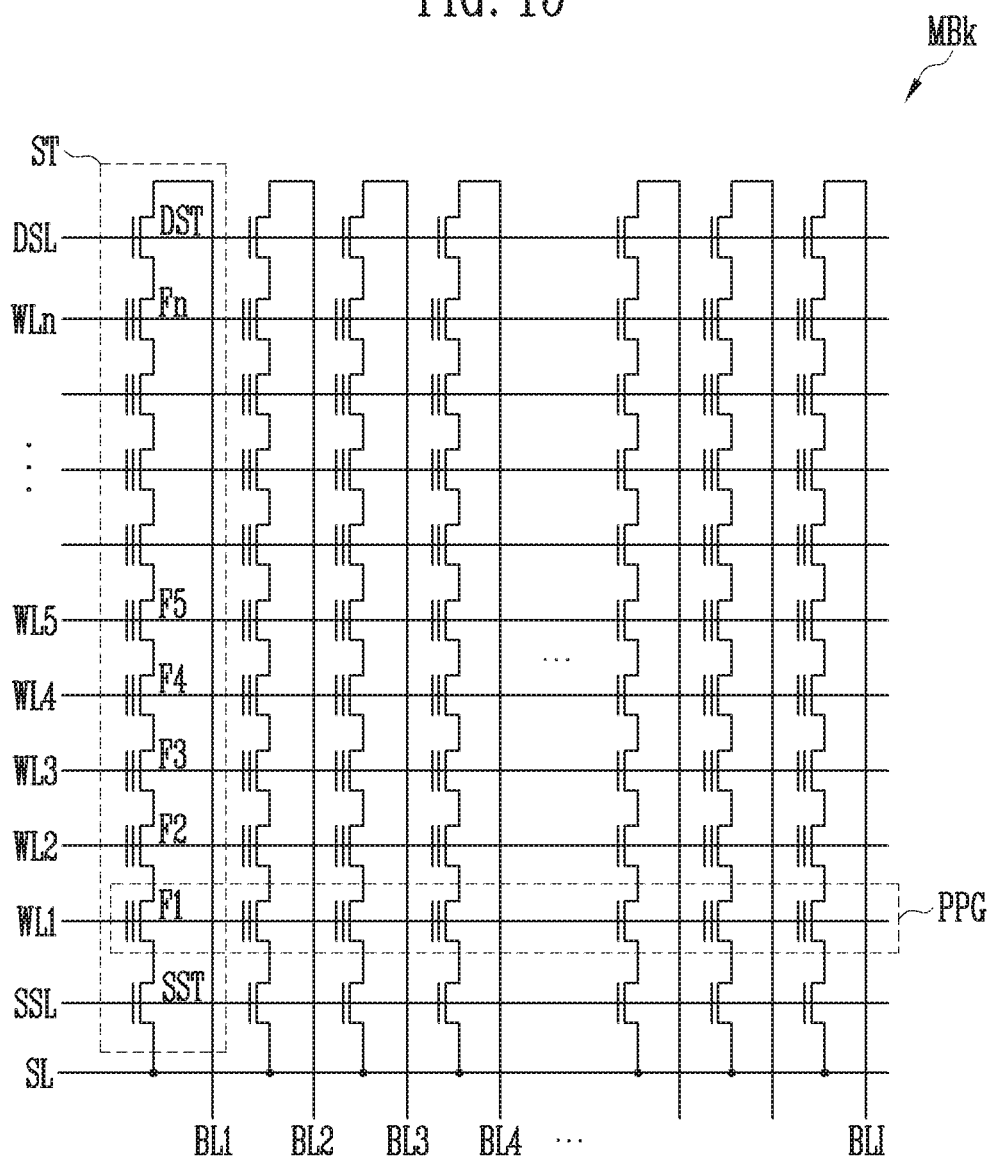
FIG. 15 is a diagram illustrating a memory block having a 2D structure.

FIG. 15 is a diagram illustrating a memory block having a 2D structure.

A memory cell array may include a plurality of memory blocks, and any one memory block MBk of the plurality of memory blocks is illustrated in FIG. 15 for convenience of description.

The memory block MBk may include a plurality of cell strings ST coupled between bit lines BL1 to BLI and a source line SL. The cell strings ST may be coupled to the bit lines BL1 to BLI, respectively, and may be coupled in common to the source line SL. Since the cell strings ST may have a similar structure, the cell string ST coupled to the first bit line BL1 will be described below by way of example.

The cell string ST may include a source select transistor SST, first to n-th memory cells F1 to Fn (where n is a positive integer), and a drain select transistor DST coupled in series between the source line SL and the first bit line BL1. The number of source select transistors SST and the number of drain select transistors DST are not limited to specific numbers illustrated in FIG. 15.

The source select transistor SST may be coupled between the source line SL and the first memory cell F1. The first to n-th memory cells F1 to Fn may be coupled in series between the source select transistor SST and the drain select transistor DST. The drain select transistor DST may be coupled between the n-th memory cell Fn and the first bit line BL1. Although not illustrated in the drawing, dummy cells may be further coupled between the memory cells F1 to Fn or between the source select transistor SST and the drain select transistor DST.

The gates of the source select transistors SST included in respective cell strings ST may be coupled to a source select line SSL. The gates of the first to n-th memory cells F1 to Fn may be coupled to first to n-th word lines WL1 to WLn, respectively. The gates of the drain select transistors DST may be coupled to a drain select line DSL. Here, a group of memory cells coupled to each of the word lines WL1 to WLn may be referred to as a "physical page (PPG)". For example, a group of first memory cells F1 coupled to the first word line WL1, among the memory cells F1 to Fn included in different cell strings ST, may be a single physical page PPG. When a multi-level cell (MLC) scheme is used, a plurality of logical pages may be included in a single physical page PPG.

Figure 16:
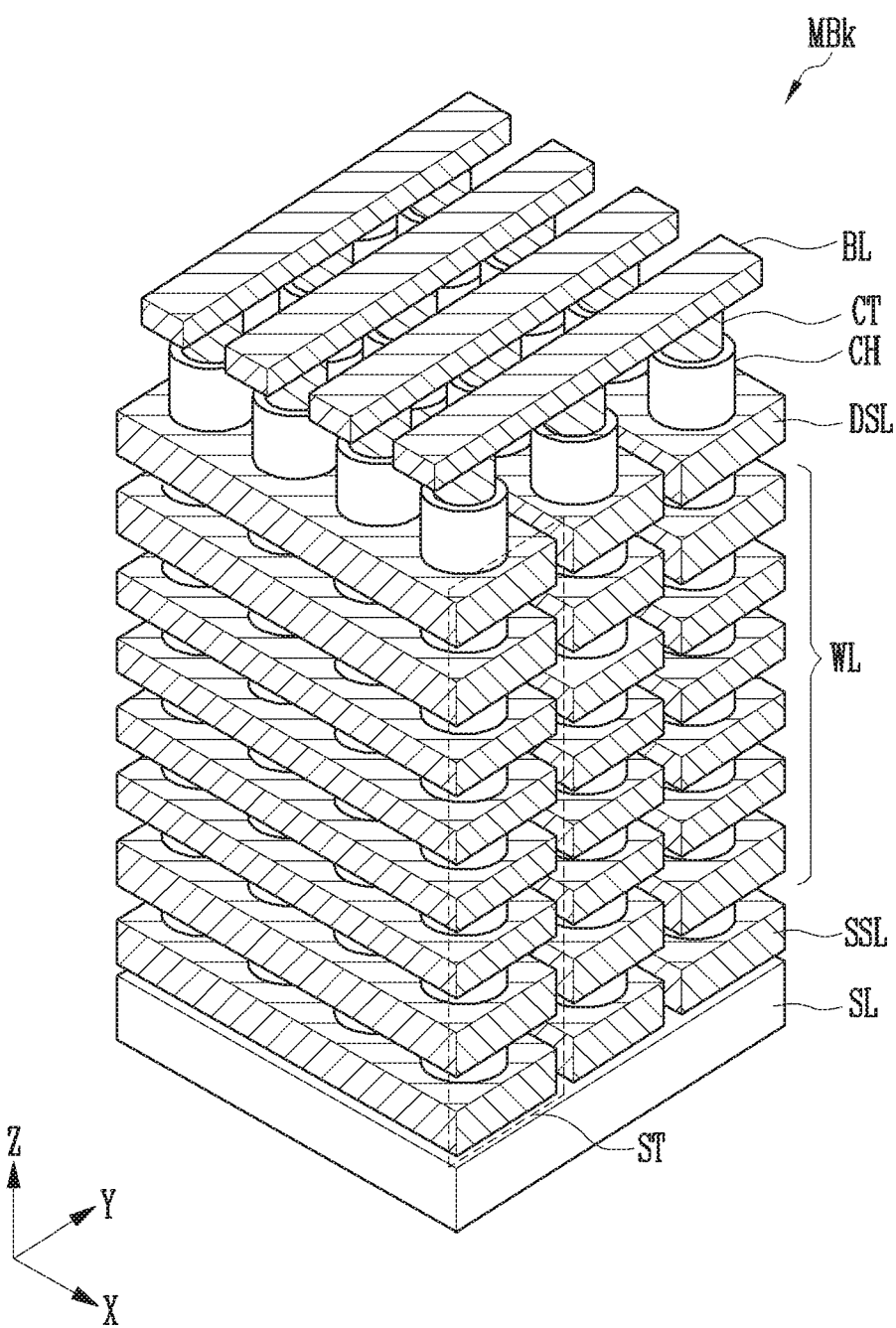
FIG. 16 is a diagram illustrating an example of a memory block having a 3D structure.

FIG. 16 is a diagram illustrating an example of a memory block having a 3D structure.

A memory cell array may include a plurality of memory blocks, and any one memory block MBk of the plurality of memory blocks is illustrated in FIG. 16 for convenience of description.

Referring to FIG. 16, the memory block MBk having a 3D structure may be formed on a substrate in an I-shape in a direction vertical to the substrate (i.e., a Z direction). The memory block MBk may include a plurality of cell strings ST arranged between bit lines BL and a source line SL. In an embodiment of the present disclosure, a well may be formed instead of the source line SL. This structure may be called a "Bit Cost Scalable" (BiCS) structure". For example, in a case where the source line SL is horizontally formed on the substrate, cell strings ST having a BiCS structure may be formed on the source line SL in the direction vertical to the substrate (i.e., the Z direction).

In detail, the cell strings ST may be individually arranged in a first direction (i.e., an X direction) and in a second direction (i.e., a Y direction). The cell strings ST may include source select lines SSL, word lines WL, and drain select lines DSL which are stacked while being spaced apart from each other. The number of source select lines SSL, the number of word lines WL, and the number of drain select lines DSL are not limited to those illustrated in the drawing, and may vary according to the embodiment. The cell strings ST may include vertical channel layers CH and bit lines BL. The vertical channel layers CH may be formed to vertically pass through the source select lines SSL, the word lines WL, and the drain select lines DSL. The bit lines BL may come into contact with the tops of the vertical channel layers CH that protrude upwardly from the drain select lines DSL, and may be extended in the second direction (i.e., the Y direction). The memory cells may be formed between the word lines WL and the vertical channel layers CH. Contact plugs CT may be further formed between the bit lines BL and the vertical channel layers CH.

Figure 17:
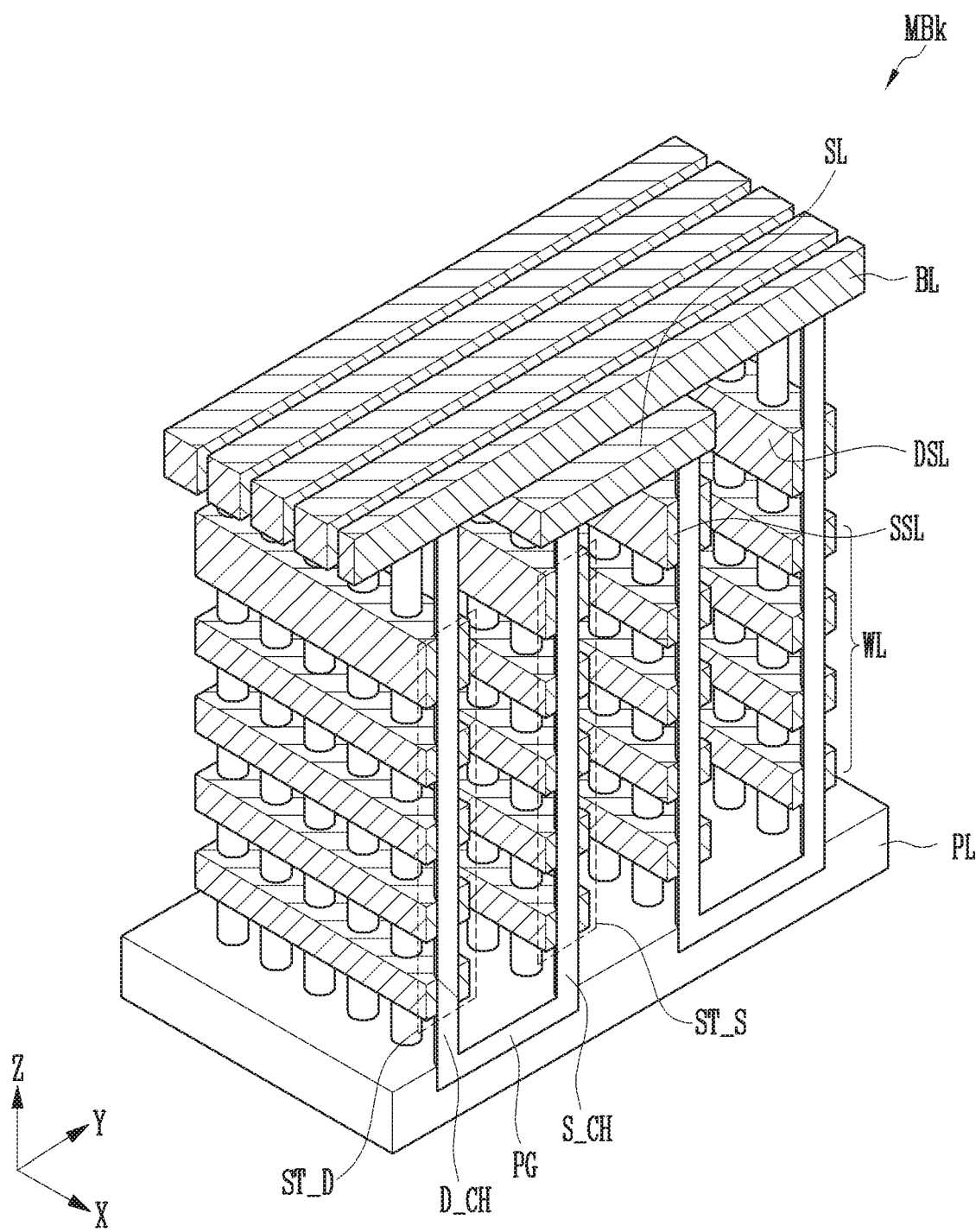
FIG. 17 is a diagram illustrating an example of a memory block having a 3D structure.

FIG. 17 is a diagram illustrating an example of a memory block having a 3D structure.

A memory cell array may include a plurality of memory blocks, and any one memory block MBk of the plurality of memory blocks is illustrated in FIG. 17 for convenience of description.

Referring to FIG. 17, the memory block MBk having a 3D structure may be formed on a substrate in a U-shape in a direction vertical to the substrate (i.e., a Z direction). The memory block MBk may include source strings ST_S and drain strings ST_D which are coupled between bit lines BL and a source line SL and which form pairs. Each source string ST_S and the corresponding drain string ST_D may be coupled to each other through a pipe gate PG to form a U-shape. The pipe gate PG may be formed in a pipeline PL. In more detail, the source strings ST_S may be formed to be vertical to the substrate between source lines SL and the pipeline PL, and the drain strings ST_D may be formed to be vertical to the substrate between the bit lines BL and the pipeline PL. This structure may be called a Pipe-shaped Bit Cost Scalable (P-BiCS) structure.

In detail, the drain strings ST_D and the source strings ST_S may be individually arranged in a first direction (i.e., an X direction) and in a second direction (i.e., a Y direction). The drain strings ST_D and the source strings ST_S may be alternately arranged along the second direction (i.e., the Y direction). Each of the drain strings ST_D may include word lines WL and a drain select line DSL which are stacked while being spaced apart from each other. Each of the drain strings ST_D may include a drain vertical channel layer D_CH formed to vertically pass through the word lines WL and the drain select line DSL. Each of the source strings ST_S may include word lines WL and a source select line SSL which are stacked while being spaced apart from each other. Each of the source strings ST_S may include a source vertical channel layer S_CH formed to vertically pass through the word lines WL and the source select line SSL. The drain vertical channel layers D_CH and the source vertical channel layers S_CH may be coupled to each other via corresponding pipe gates PG in the pipeline PL. The bit lines BL may come into contact with the tops of the drain vertical channel layers D_CH that protrude upwardly from the drain select lines DSL, and may be extended in the second direction (i.e., the Y direction).

Figure 18:
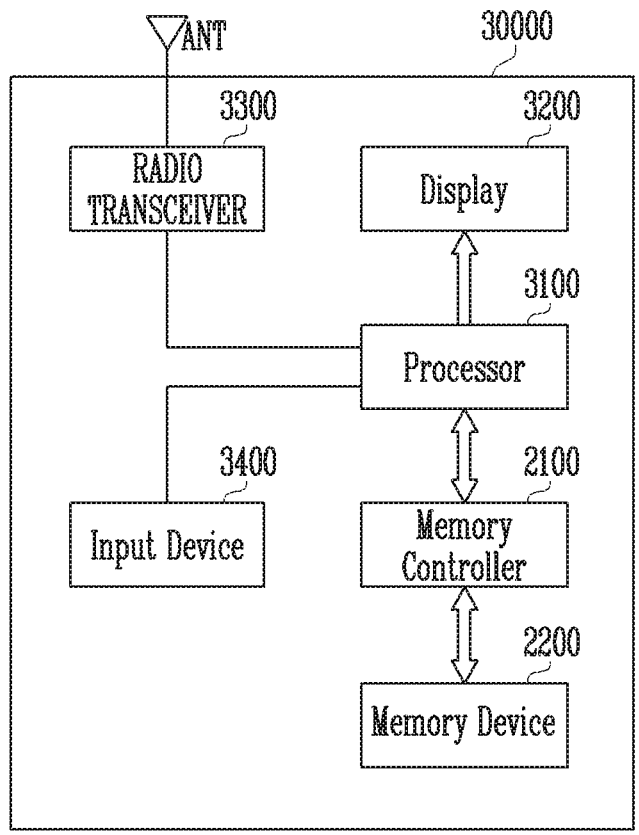
FIGS. 18 to 21 are diagrams illustrating an embodiment of a memory system including the memory controller of FIGS. 13A and 13B.

FIG. 18 is a diagram illustrating an embodiment of a memory system including the memory controller of FIGS. 13A and 13B.

Referring to FIG. 18, a memory system 30000 may be implemented as a cellular phone, a smartphone, a tablet personal computer (PC), a personal digital assistant (PDA) or a wireless communication device. The memory system 30000 may include a memory device 2200 and a memory controller 2100 that is capable of controlling the operation of the memory device 2200. The memory device 2200, illustrated in FIG. 18, may correspond to the memory device 2200a illustrated in FIG. 13A or the memory device 2200b illustrated in FIG. 13B. The memory controller 2100, illustrated in FIG. 18, may correspond to the memory controller 2100a illustrated in FIG. 13A or the memory controller 2100b illustrated in FIG. 13B.

The memory controller 2100 may control a data access operation, e.g., a program, erase, or read operation, of the memory device 2200 under the control of a processor 3100.

Data programmed in the memory device 2200 may be output through a display 3200 under the control of the memory controller 2100.

A radio transceiver 3300 may send and receive radio signals through an antenna ANT. For example, the radio transceiver 3300 may change a radio signal received through the antenna ANT into a signal which may be processed by the processor 3100. Therefore, the processor 3100 may process a signal output from the radio transceiver 3300 and transmit the processed signal to the memory controller 2100 or the display 3200. The memory controller 2100 may transmit a signal processed by the processor 3100 to the memory device 2200. Furthermore, the radio transceiver 3300 may change a signal output from the processor 3100 into a radio signal, and output the changed radio signal to the external device through the antenna ANT. An input device 3400 may be used to input a control signal for controlling the operation of the processor 3100 or data to be processed by the processor 3100. The input device 3400 may be implemented as a pointing device such as a touch pad or a computer mouse, a keypad or a keyboard. The processor 3100 may control the operation of the display 3200 such that data output from the memory controller 2100, data output from the radio transceiver 3300, or data output from the input device 3400 is output through the display 3200.

In an embodiment of the present disclosure, the memory controller 2100 capable of controlling the operation of the memory device 2200 may be implemented as a part of the processor 3100 or as a chip provided separately from the processor 3100.

Figure 19:
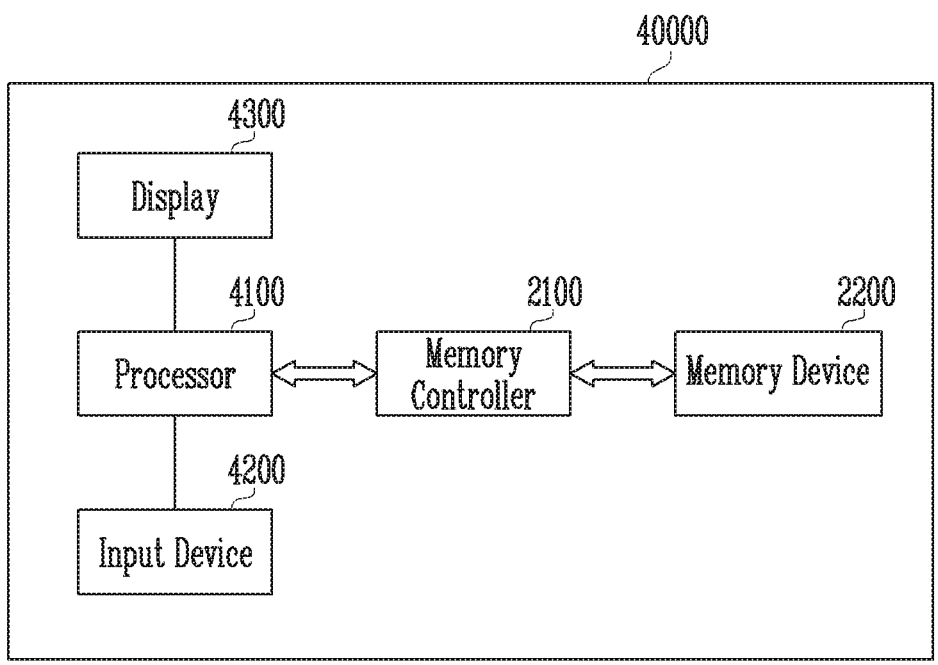

FIG. 19 is a diagram illustrating an embodiment of a memory system including the memory controller of FIGS. 13A and 13B.

Referring to FIG. 19, a memory system 40000 may be embodied in a personal computer, a tablet PC, a net-book, an e-reader, a personal digital assistant (PDA), a portable multimedia player (PMP), an MP3 player, or an MP4 player.

The memory system 40000 may include a memory device 2200 and a memory controller 2100 that is capable of controlling the data processing operation of the memory device 2200. The memory device 2200, illustrated in FIG. 19, may correspond to the memory device 2200a illustrated in FIG. 13A or the memory device 2200b illustrated in FIG. 13B. The memory controller 2100, illustrated in FIG. 19, may correspond to the memory controller 2100a illustrated in FIG. 13A or the memory controller 2100b illustrated in FIG. 13B.

A processor 4100 may output data stored in the memory device 2200 through a display 4300, according to data input from an input device 4200. For example, the input device 4200 may be implemented as a point device such as a touch pad or a computer mouse, a keypad or a keyboard.

The processor 4100 may control the overall operation of the memory system 40000 and control the operation of the memory controller 2100. In an embodiment of the present disclosure, the memory controller 2100 capable of controlling the operation of the memory device 2200 may be implemented as a part of the processor 4100 or as a chip provided separately from the processor 4100.

Figure 20:
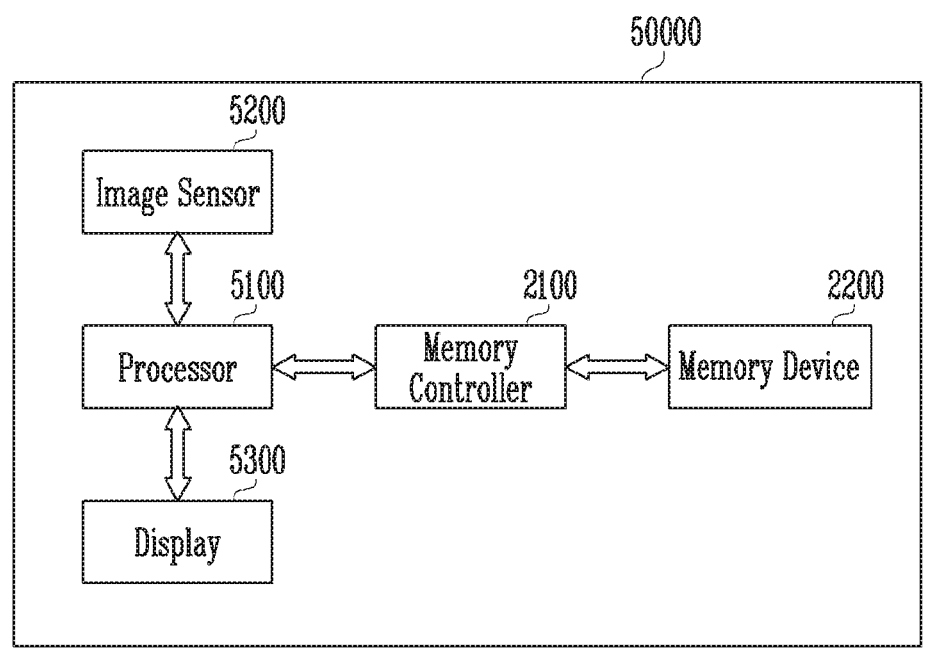

FIG. 20 is a diagram illustrating an embodiment of a memory system including the memory controller of FIGS. 13A and 13B.

Referring to FIG. 20, a memory system 50000 may be embodied in an image processing device, e.g., a digital camera, a portable phone provided with a digital camera, a smartphone provided with a digital camera, or a tablet PC provided with a digital camera.

The memory system 50000 may include a memory device 2200 and a memory controller 2100 that is capable of controlling a data processing operation, e.g., a program, erase, or read operation, of the memory device 2200. The memory device 2200, illustrated in FIG. 20, may correspond to the memory device 2200a illustrated in FIG. 13A or the memory device 2200b illustrated in FIG. 13B. The memory controller 2100, illustrated in FIG. 20, may correspond to the memory controller 2100a illustrated in FIG. 13A or the memory controller 2100b illustrated in FIG. 13B.

An image sensor 5200 of the memory system 50000 may convert an optical image into digital signals. The converted digital signals may be transmitted to a processor 5100 or the memory controller 2100. Under the control of the processor 5100, the converted digital signals may be output through a display 5300 or stored in the memory device 2200 through the memory controller 2100. Data stored in the memory device 2200 may be output through the display 5300 under the control of the processor 5100 or the memory controller 2100.

In an embodiment of the present disclosure, the memory controller 2100 capable of controlling the operation of the memory device 2200 may be implemented as a part of the processor 5100, or as a chip provided separately from the processor 5100.

Figure 21:
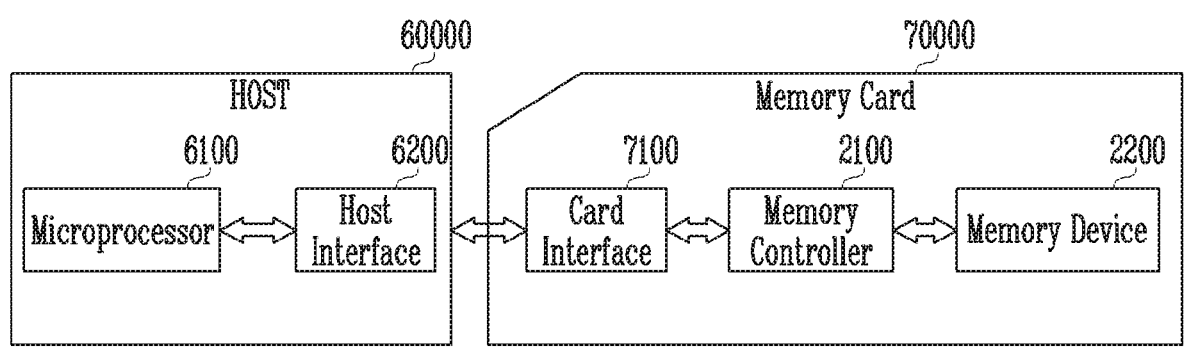

FIG. 21 is a diagram illustrating an embodiment of a memory system including the memory controller of FIGS. 13A and 13B.

Referring to FIG. 21, a memory system 70000 may be embodied in a memory card or a smart card. The memory system 70000 may include a memory controller 2100, a memory device 2200, and a card interface 7100. The memory device 2200, illustrated in FIG. 21, may correspond to the memory device 2200a illustrated in FIG. 13A or the memory device 2200b illustrated in FIG. 13B. The memory controller 2100, illustrated in FIG. 21, may correspond to the memory controller 2100a illustrated in FIG. 13A or the memory controller 2100b illustrated in FIG. 13B.

The memory controller 2100 may control data exchange between the memory device 2200 and the card interface 7100. In an embodiment of the present disclosure, the card interface 7100 may be a secure digital (SD) card interface or a multi-media card (MMC) interface, but it is not limited thereto.

The card interface 7100 may interface data exchange between a host 60000 and the memory controller 2100 according to a protocol of the host 60000. In an embodiment of the present disclosure, the card interface 7100 may support a universal serial bus (USB) protocol, and an interchip USB (IC-USB) protocol. Here, the card interface 7100 may refer to hardware capable of supporting a protocol which is used by the host 60000, software installed in the hardware, or a signal transmission method.

When the memory system 70000 is connected to a host interface 6200 of the host 60000 such as a PC, a tablet PC, a digital camera, a digital audio player, a cellular phone, a console video game hardware or a digital set-top box, the host interface 6200 may perform data communication with the memory device 2200 through the card interface 7100 and the memory controller 2100 under the control of a microprocessor 6100.

In accordance with the present disclosure, a parity-check matrix of a QC-LDPC code may be transformed.

In accordance with the present disclosure, a parity-check matrix having full rank may be generated.

While the exemplary embodiments of the present disclosure have been disclosed for illustrative purposes, those skilled in the art will appreciate that various modifications, additions and substitutions are possible. Therefore, the scope of the present disclosure must be defined by the appended claims and equivalents of the claims rather than by the description preceding them.

What is claimed is:

1. A circuit for transforming a parity-check matrix of a Quasi-Cyclic Low-Density Parity-Check (QC-LDPC) code including circulant matrices, the circuit comprising:
   a determination component configured to determine whether a parity-check matrix that is externally input has full rank;
   a selection component configured to detect linearly dependent rows or columns, among rows or columns of the parity-check matrix, based on a result of the determination of the determination component, and select any one row or column from among the linearly dependent rows or columns; and
   an entry replacement component configured to replace any one of circulant matrices included in the selected one row or column with a zero matrix.

2. The circuit according to claim 1, wherein, when two or more groups for the linearly dependent rows or columns are detected, the selection component selects any one row or column from each of the groups.

3. The circuit according to claim 1, further comprising:
   a matrix storage component configured to store the externally-input parity-check matrix having full rank, or store the parity-check matrix including the one circulant matrix that is replaced with a zero matrix.

4. The circuit according to claim 1, wherein the entry replacement component replaces a circulant matrix corresponding to a predetermined cycle, among the circulant matrices included in the one row or column, with a zero matrix.

5. The circuit according to claim 4, wherein the entry replacement component replaces a circulant matrix corresponding to a shortest cycle, among cycles to which the circulant matrices included in the one row or column correspond, with a zero matrix.

6. The circuit according to claim 4, wherein, when a plurality of circulant matrices, among the circulant matrices included in the one row or column, correspond to a predetermined cycle, the entry replacement component replaces any one of the plurality of circulant matrices with a zero matrix based on a number of times that each of the plurality of circulant matrices corresponds to the predetermined cycle.

7. The circuit according to claim 6, wherein the entry replacement component replaces a circulant matrix that corresponds most to the predetermined cycle, among the plurality of circulant matrices, with a zero matrix.

8. The circuit according to claim 7, wherein, when two or more circulant matrices, among the plurality of circulant matrices, correspond most to the predetermined cycle, the entry replacement component replaces a circulant matrix that corresponds most to a cycle subsequent to the predetermined cycle, among the two or more circulant matrices, with a zero matrix.

9. An error correction circuit for performing error correction decoding using a parity-check matrix of a QC-LDPC code including circulant matrices, the error correction circuit comprising:
   a parity-check matrix transformation circuit configured to determine whether a parity-check matrix that is externally input has full rank, detect linearly dependent rows or columns, among rows or columns of the parity-check matrix based on a result of the determination, select any one row or column from among the linearly dependent rows or columns, and replace any one of circulant matrices included in the selected one row or column with a zero matrix; and
   an error correction decoder configured to perform error correction decoding using a parity-check matrix in which the one circulant matrix is replaced with a zero matrix.

10. The error correction circuit according to claim 9, wherein, when two or more groups for the linearly dependent rows or columns are detected, the parity-check matrix transformation circuit selects any one row or column from each of the groups.

11. The error correction circuit according to claim 9, wherein the parity-check matrix transformation circuit stores the externally-input parity-check matrix having full rank, or stores the parity-check matrix including the one circulant matrix that is replaced with a zero matrix.

12. The error correction circuit according to claim 9, wherein the parity check matrix transform circuit replaces a circulant matrix corresponding to a predetermined cycle, among the circulant matrices included in the one row or column, with a zero matrix.

13. The error correction circuit according to claim 12, wherein the parity-check matrix transformation circuit replaces a circulant matrix corresponding to a shortest cycle, among cycles to which the circulant matrices included in the one row or column correspond, with a zero matrix.

14. The error correction circuit according to claim 12, wherein, when a plurality of circulant matrices, among the circulant matrices included in the one row or column, correspond to a predetermined cycle, the parity-check matrix transformation circuit replaces any one of the plurality of circulant matrices with a zero matrix based on a number of times that each of the plurality of circulant matrices corresponds to the predetermined cycle.

15. The error correction circuit according to claim 14, wherein the parity-check matrix transformation circuit replaces a circulant matrix that corresponds most to the predetermined cycle, among the plurality of circulant matrices, with a zero matrix.

16. The error correction circuit according to claim 15, wherein, when two or more circulant matrices, among the plurality of circulant matrices, correspond most to the predetermined cycle, the parity-check matrix transformation circuit replaces a circulant matrix that corresponds most to a cycle subsequent to the predetermined cycle, among the two or more circulant matrices, with a zero matrix.

\* \* \* \* \*